United States Patent
Tanaka

(10) Patent No.: US 11,948,953 B2
(45) Date of Patent: Apr. 2, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Harumi Tanaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 404 days.

(21) Appl. No.: 17/271,245

(22) PCT Filed: Jul. 31, 2019

(86) PCT No.: PCT/JP2019/029978
§ 371 (c)(1),
(2) Date: Feb. 25, 2021

(87) PCT Pub. No.: WO2020/049904
PCT Pub. Date: Mar. 12, 2020

(65) Prior Publication Data
US 2021/0399038 A1    Dec. 23, 2021

(30) Foreign Application Priority Data

Sep. 6, 2018  (JP) ................................. 2018-166680

(51) Int. Cl.
*H01L 27/146*    (2006.01)
(52) U.S. Cl.
CPC .. *H01L 27/14623* (2013.01); *H01L 27/14685* (2013.01)
(58) Field of Classification Search
CPC ......... H01L 27/14623; H01L 27/14685; H01L 27/146; H01L 27/14621; H01L 27/14645; H04N 25/00; H04N 25/77; H04N 25/79
See application file for complete search history.

(56) References Cited

U.S. PATENT DOCUMENTS

| 2014/0131779 A1 | 5/2014 | Takeda |
| 2015/0069471 A1 | 3/2015 | Kawamura |

(Continued)

FOREIGN PATENT DOCUMENTS

| CN | 103811507 A | 5/2014 |
| CN | 104425535 A | 3/2015 |

(Continued)

OTHER PUBLICATIONS

International Search Report and Written Opinion of PCT Application No. PCT/JP2019/029978, dated Oct. 15, 2019, 08 pages of ISRWO.

*Primary Examiner* — Nikolay K Yushin
(74) *Attorney, Agent, or Firm* — CHIP LAW GROUP

(57) ABSTRACT

Provided is a solid-state imaging device including: a photoelectric conversion unit that converts received light into an electric charge; a memory unit that holds the electric charge; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is in a transfer region for transferring the electric charge, and the second embedded portion is outside the transfer region. The lid portion includes at least one recessed structure.

10 Claims, 16 Drawing Sheets

(56) References Cited

U.S. PATENT DOCUMENTS

2016/0027682 A1     1/2016   Okujo et al.
2019/0157330 A1     5/2019   Sato et al.

FOREIGN PATENT DOCUMENTS

| | | |
|---|---:|---|
| CN | 105321802 A | 2/2016 |
| CN | 109314123 A | 2/2019 |
| EP | 3483938 A1 | 5/2019 |
| JP | 2014-096490 A | 5/2014 |
| JP | 2015-053411 A | 3/2015 |
| JP | 2015-228510 A | 12/2015 |
| JP | 2016-032001 A | 3/2016 |
| KR | 10-2019-0024895 A | 3/2019 |
| TW | 201604938 A | 2/2016 |
| WO | 2018/008614 A1 | 1/2018 |

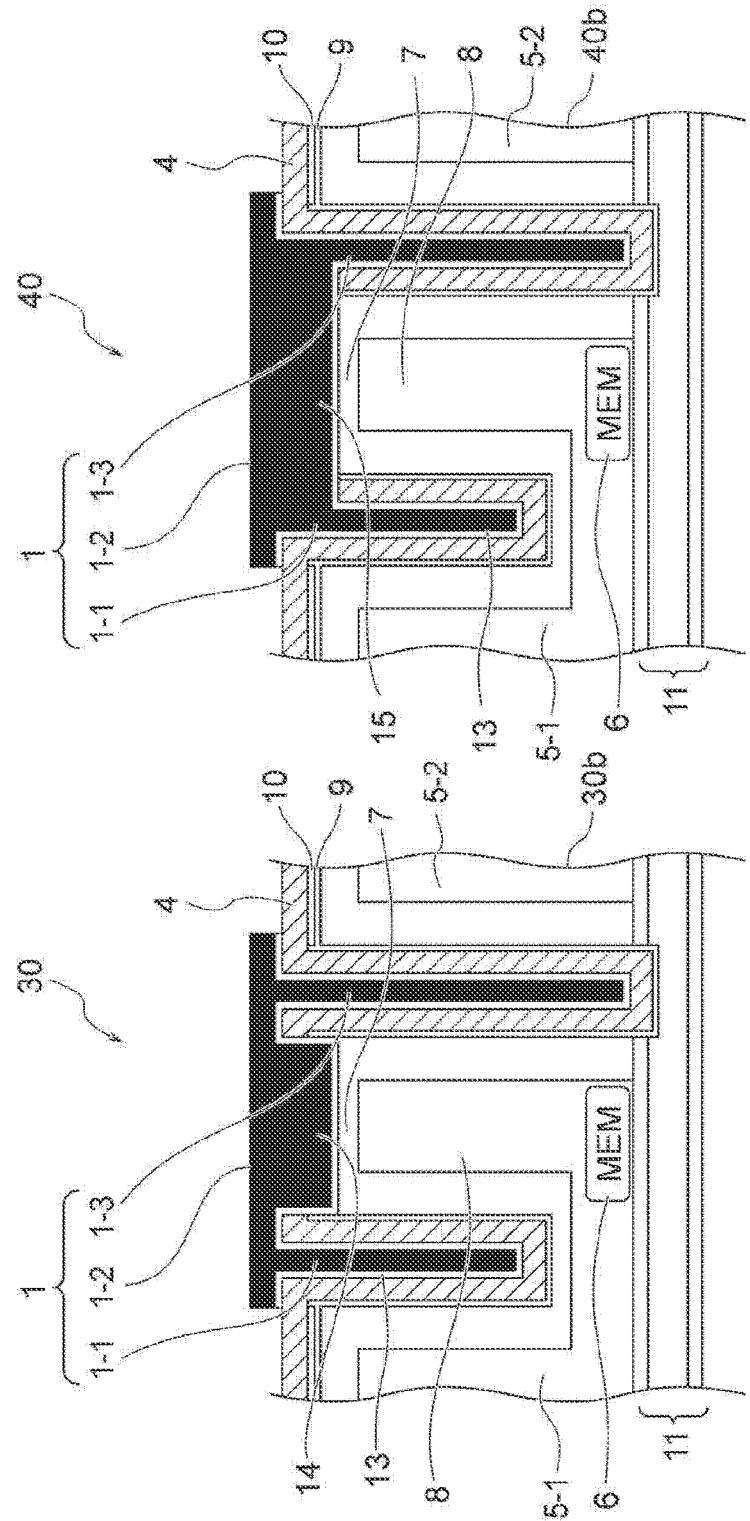

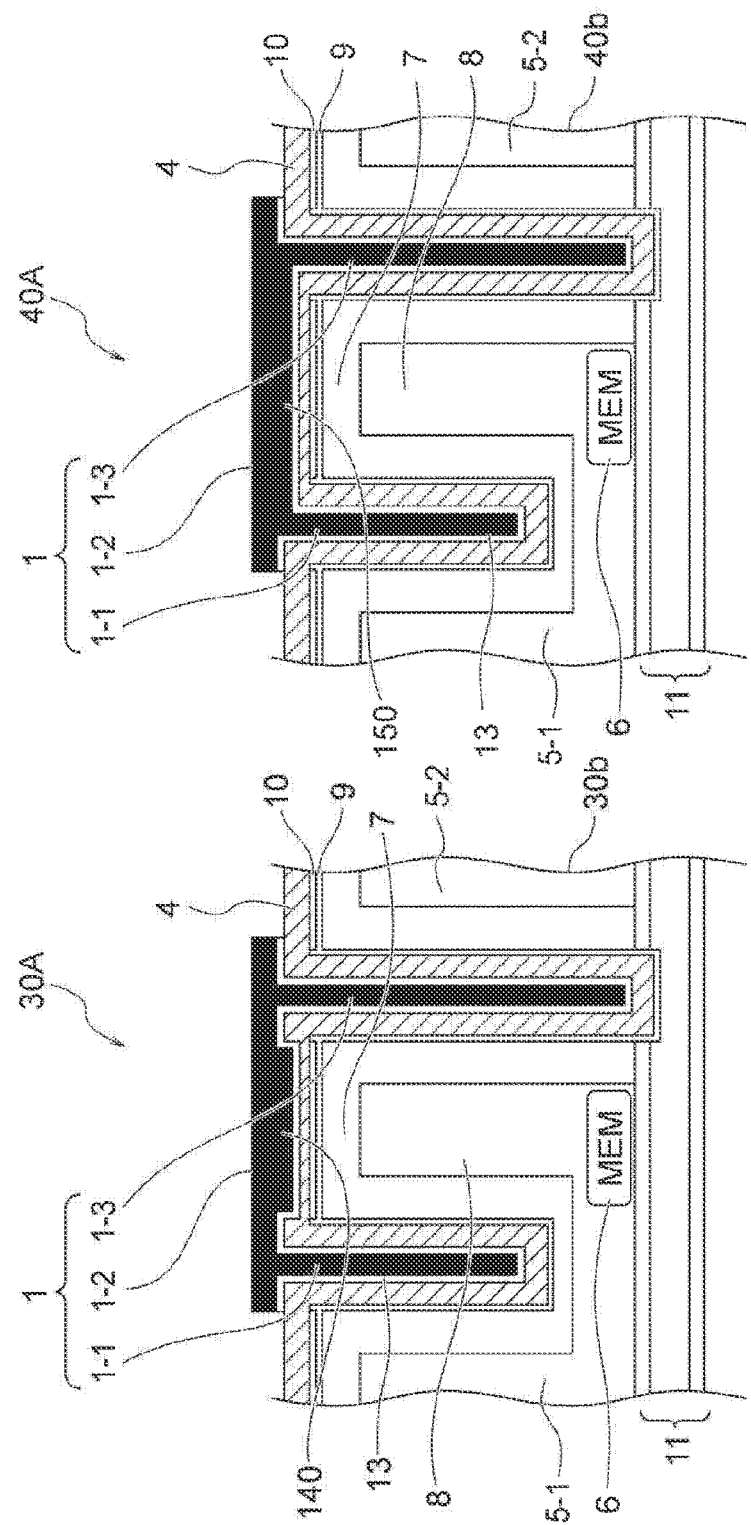

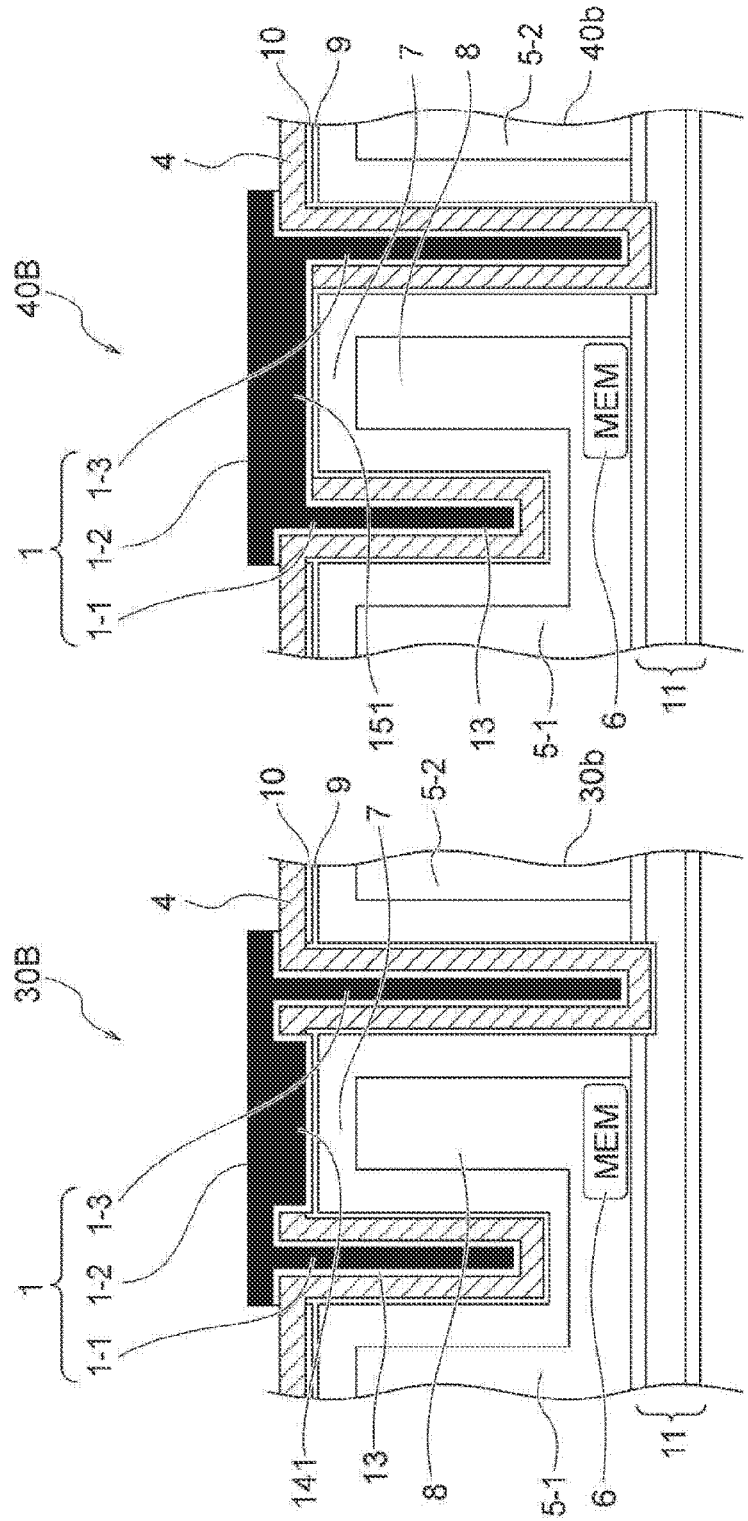

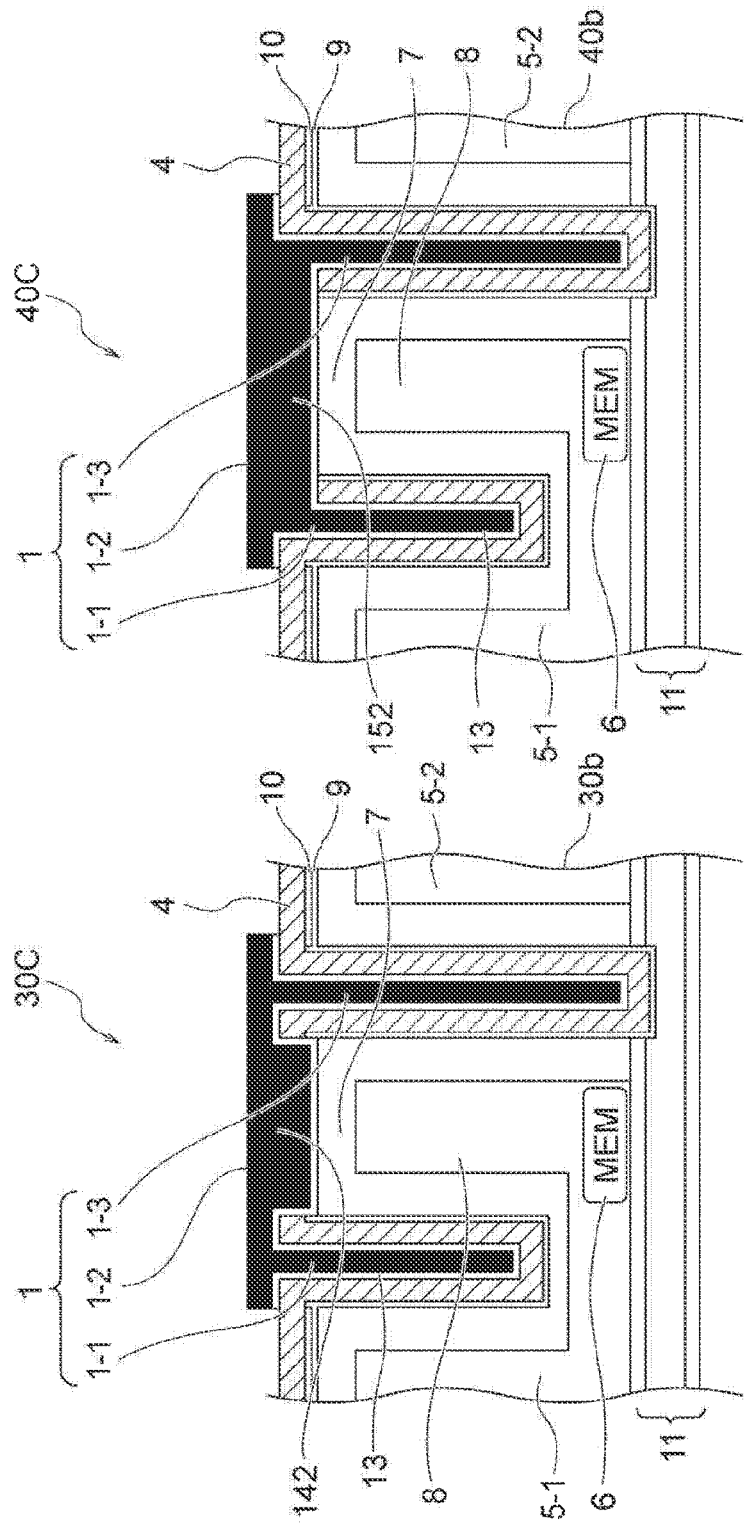

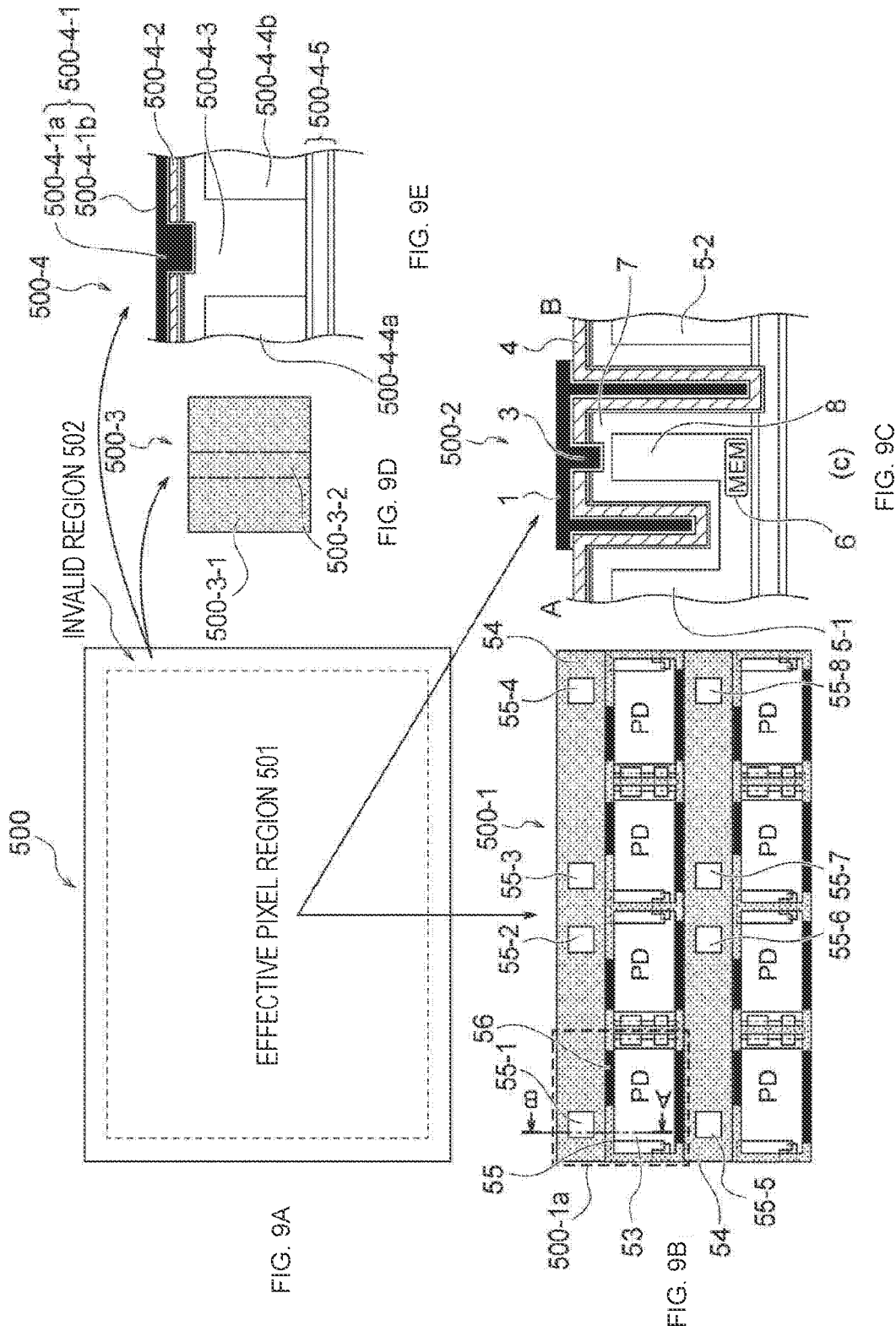

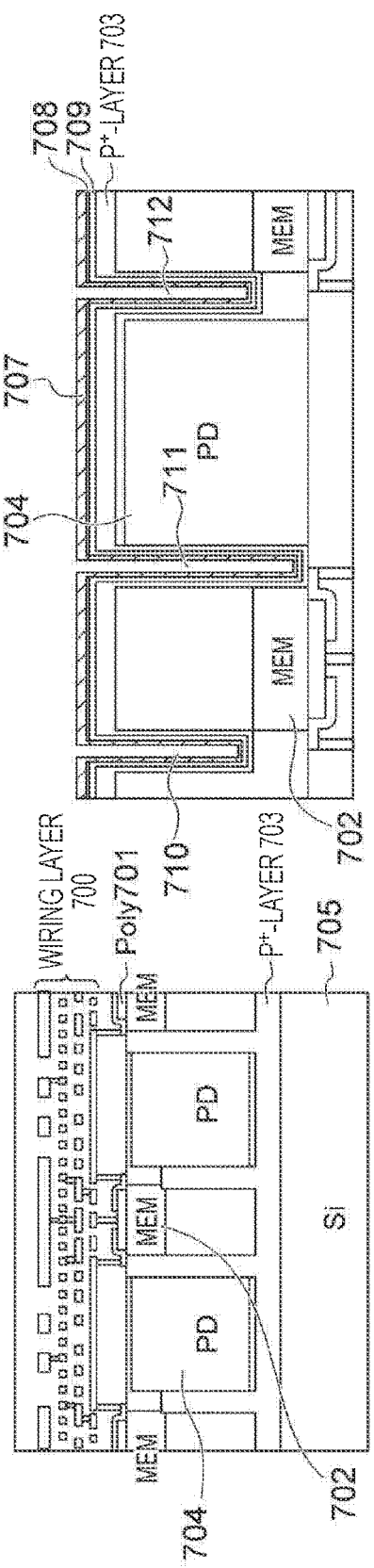
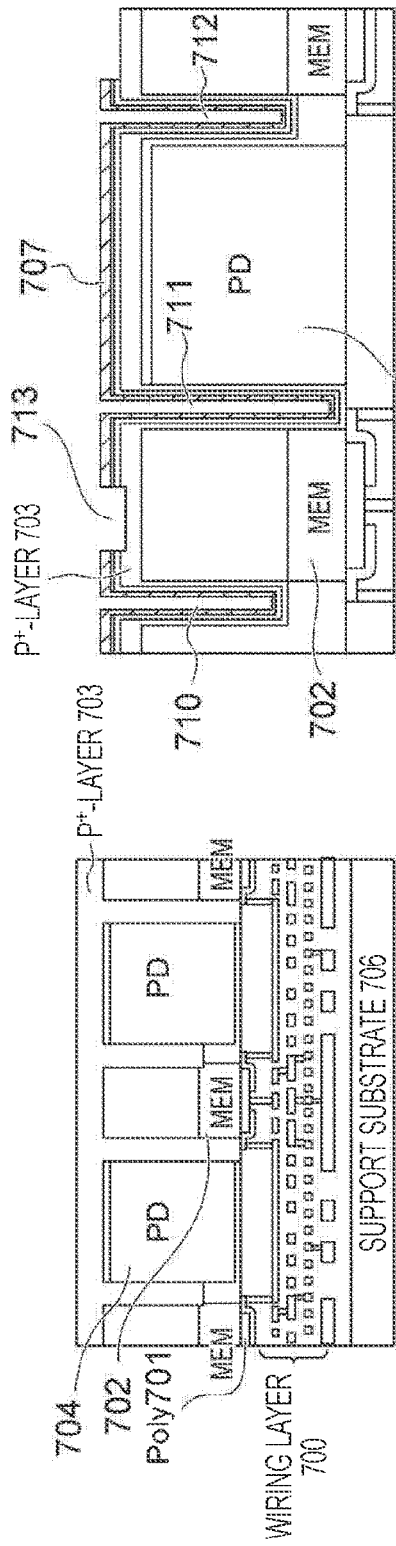
FIG. 11A
FIG. 11B
FIG. 11C
FIG. 11D

SOLID-STATE IMAGING DEVICE AND ELECTRONIC APPARATUS

CROSS REFERENCE TO RELATED APPLICATIONS

This application is a U.S. National Phase of International Patent Application No. PCT/JP2019/029978 filed on Jul. 31, 2019, which claims priority benefit of Japanese Patent Application No. JP 2018-166680 filed in the Japan Patent Office on Sep. 6, 2018. Each of the above-referenced applications is hereby incorporated herein by reference in its entirety.

TECHNICAL FIELD

The present technology relates to a solid-state imaging device and an electronic apparatus.

BACKGROUND ART

In general, solid-state imaging devices such as complementary metal oxide semiconductor (CMOS) image sensors and charge coupled devices (CCDs) are widely used in digital still cameras, digital video cameras, and the like.

Light that has entered a CMOS image sensor is photoelectrically converted by the photodiodes (PDs) included in the pixels. Further, the electric charges generated in the PDs are transferred to floating diffusions (FDs) via transfer transistors, and are then converted into pixel signals at the levels corresponding to the quantities of received light.

Meanwhile, in a conventional CMOS image sensor, a method of sequentially reading pixel signals from the respective pixels row by row, or a so-called rolling shutter method, is normally adopted. Therefore, an image might be distorted due to a difference in the timing of exposure. In view of this, there is a disclosed CMOS image sensor that adopts a so-called global shutter method that is a method of simultaneously reading pixel signals from all the pixels by providing a charge retention unit in the pixels, and has a simultaneous electronic shutter function for all the pixels. As the global shutter method is adopted, the timing of exposure becomes the same at all the pixels, and distortions in images can be prevented.

For example, a solid-state imaging device including a photodiode (PD), a charge retention unit, and a light blocking unit has been suggested (see Patent Document 1).

CITATION LIST

Patent Document

Patent Document 1: Japanese Patent Application Laid-Open No. 2015-228510

SUMMARY OF THE INVENTION

Problems to be Solved by the Invention

However, the technology suggested in Patent Document 1 may not be able to further improve image quality.

Therefore, the present technology has been made in view of such circumstances, and the principal object of the present technology is to provide a solid-state imaging device capable of improving image quality and an electronic apparatus including the solid-state imaging device mounted therein.

Solutions to Problems

As a result of intensive studies conducted to solve the above object, the present inventors have succeeded in dramatically improving image quality, and have completed the present technology.

That is, the present technology provides a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure.

The solid-state imaging device according to the present technology may include a high-dielectric-constant material film on the back surface side of the semiconductor substrate, which is the side at which light enters the photoelectric conversion unit. The lid portion and the high-dielectric-constant material film may be arranged in this order from the light incident side. In this case, the at least one recessed structure is formed by digging the high-dielectric-constant material film, starting from a lower portion of the lid portion.

The solid-state imaging device according to the present technology may include a high-dielectric-constant material film on the back surface side of the semiconductor substrate, which is the side at which light enters the photoelectric conversion unit. The lid portion and the high-dielectric-constant material film may be arranged in this order from the light incident side, and the semiconductor substrate may further include a silicon layer. In this case, the at least one recessed structure is formed by digging the high-dielectric-constant material film and the silicon layer, starting from a lower portion of the lid portion.

In the solid-state imaging device according to the present technology, the silicon layer may be a $P^+$-layer.

In the solid-state imaging device according to the present technology, the at least one recessed structure and the $P^+$-layer may be connected and dropped to the ground (GND).

In the solid-state imaging device according to the present technology, a plurality of pixels may be arranged in a matrix, the at least one recessed structure may be formed for each pixel, and a group of recessed structures in which the at least one recessed structure is continuously arranged between at least adjacent ones of the pixels may be formed.

In the solid-state imaging device according to the present technology, each recessed structure in the group of continuously arranged recessed structures may be disposed in conformity with symmetry of the pixel.

In the solid-state imaging device according to the present technology, a plurality of pixels may be arranged in a matrix, the at least one recessed structure may be formed for each pixel, and a group of recessed structures in which the at least one recessed structure is discontinuously arranged between at least adjacent ones of the pixels may be formed.

In the solid-state imaging device according to the present technology, each recessed structure in the group of discontinuously arranged recessed structures may be disposed in conformity with symmetry of the pixel.

The present technology also provides an electronic apparatus that includes a solid-state imaging device according to the present technology.

According to the present technology, image quality can be improved. Note that effects of the present technology are not limited to the effects described herein, and may include any of the effects described in the present disclosure.

BRIEF DESCRIPTION OF DRAWINGS

FIGS. 2A and 2B are cross-sectional views of example configurations of solid-state imaging devices to which the present technology is applied.

FIGS. 3A and 3B are cross-sectional views of example configurations of solid-state imaging devices to which the present technology is applied.

FIGS. 5A and 5B are cross-sectional views of example configurations of solid-state imaging devices to which the present technology is applied.

FIGS. 6A and 6B are cross-sectional views of example configurations of solid-state imaging devices to which the present technology is applied.

FIGS. 9A, 9B, 9C, 9D, and 9E are diagrams showing an example configuration of a solid-state imaging device to which the present technology is applied.

FIGS. 11A, 11B, 11C, and 11D are cross-sectional views showing an example method for manufacturing a solid-state imaging device to which the present technology is applied.

MODES FOR CARRYING OUT THE INVENTION

Figures 1A, 1B:
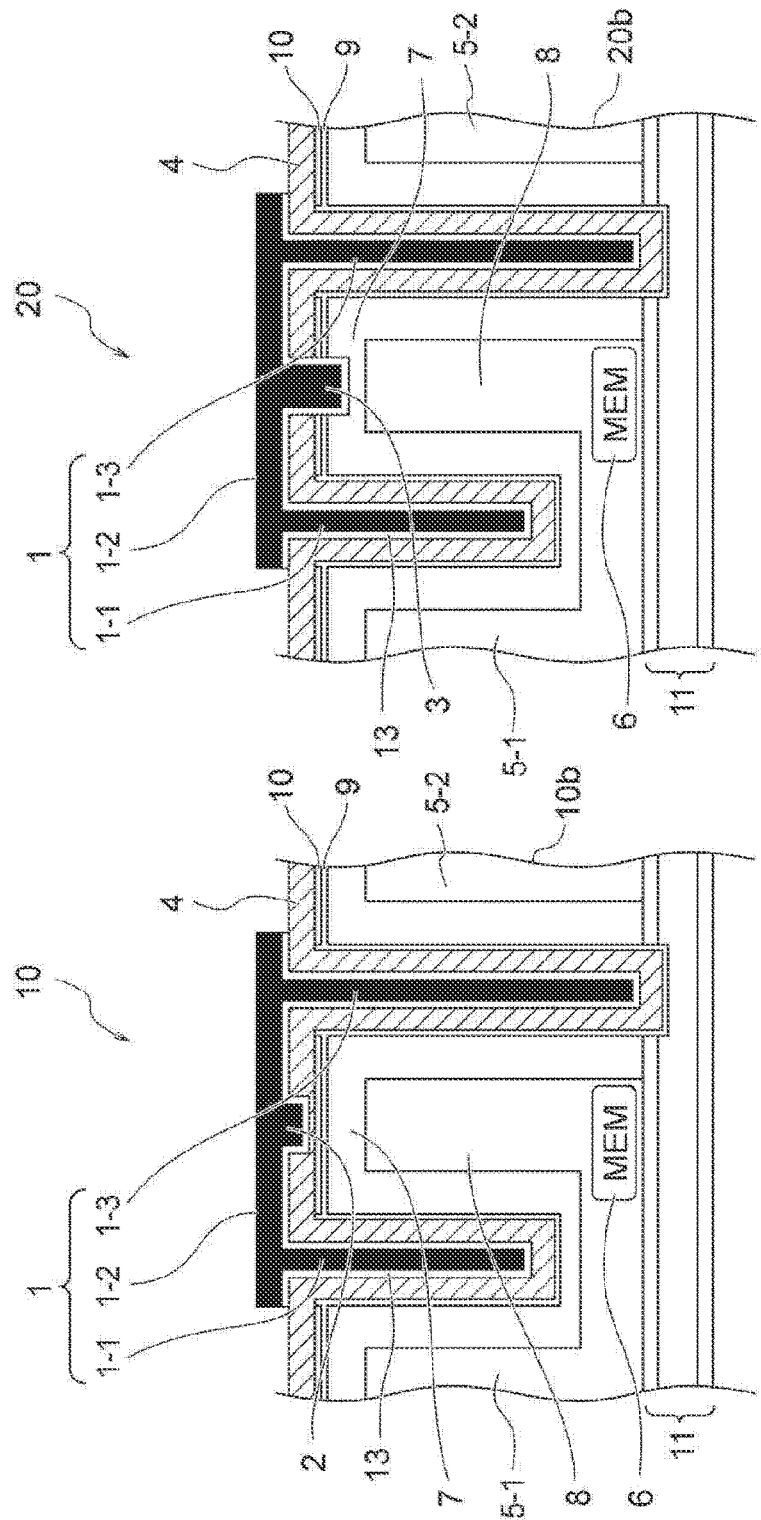
FIGS. 1A and 1B are cross-sectional views of example configurations of solid-state imaging devices to which the present technology is applied.

The following is a description of preferred embodiments for carrying out the present technology. The embodiments described below are typical examples of embodiments of the present technology, and do not narrow the interpretation of the scope of the present technology.

Note that "upper" means an upward direction in the drawings, "lower" means a downward direction in the drawings, "left" means a leftward direction in the drawings, and "right" means a rightward direction in the drawings, unless otherwise specified. Also, in the drawings, the same or equivalent components or members are denoted by the same reference numerals, and explanation of them will be repeated.

Explanation will be made in the following order.
1. Outline of the present technology
2. First embodiment (Example 1 of a solid-state imaging device)
3. Second embodiment (Example 2 of a solid-state imaging device)
4. Third embodiment (Example 3 of a solid-state imaging device)
5. Fourth embodiment (Example 4 of a solid-state imaging device)
6. Fifth embodiment (Example 5 of a solid-state imaging device)
7. Sixth embodiment (Example 6 of a solid-state imaging device)
8. Seventh embodiment (Example 7 of a solid-state imaging device)
9. Eighth embodiment (Example 8 of a solid-state imaging device)
10. Ninth embodiment (an example of an electronic apparatus)
11. Examples of use of solid-state imaging devices to which the present technology is applied 1. Outline of the Present Technology First, the outline of the present technology is described.

The present technology relates to a technology capable of further improving image quality, or more particularly, further improving dark characteristics, even in a structure that shields a memory unit (MEM) from light with a metal or the like in a back-illuminated image sensor having a global shutter function.

A structure that is of a back-illuminated type, is formed in an image sensor having a global shutter function, and shields a memory unit (MEM) from light with a metal or the like is described below, with reference to FIGS. 13 and 14.

Figure 13:
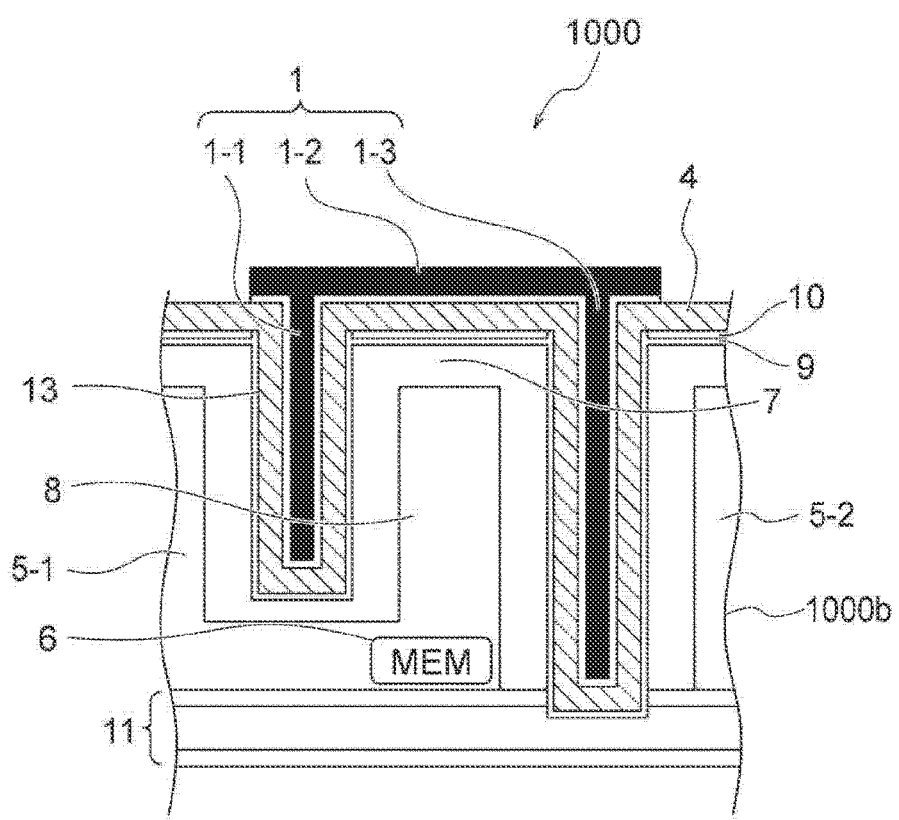
FIG. 13 is a cross-sectional view of an example configuration of a solid-state imaging device.

FIG. 13 shows a cross-sectional view of a solid-state imaging device 1000. Specifically, FIG. 13 shows in detail a peripheral portion of a memory unit 6 included in the solid-state imaging device 1000 as a cross-sectional view. In the solid-state imaging device 1000, a wiring layer (not shown) is provided on the front surface side (the lower side in FIG. 13) of a semiconductor substrate 1000*b*, and light enters from the back surface side (the upper side in FIG. 13) of the semiconductor substrate 1000*b*.

As shown in FIG. 13, a light blocking unit 1 includes: a lid portion 1-2 disposed to cover the memory unit (MEM) 6; an embedded portion 1-1 that is disposed between a PD 5-1 and the memory unit 6, extends in the semiconductor substrate 1000*b*, and is embedded in a vertical groove; and an embedded portion 1-3 that is disposed between a PD 5-2 and the memory unit 6, extends in the semiconductor substrate 1000*b* (a P$^+$-layer 7 (a P-type semiconductor region) and an N$^-$-type layer 8 (an N-type semiconductor region)), and is embedded in a vertical groove. The lid portion 1-2 is formed substantially parallel to the semiconductor substrate 1000*b*, and the embedded portions 1-1 and 1-3 are designed to reach a predetermined depth so as to extend in a direction substantially orthogonal to the lid portion 1-2.

The solid-state imaging device 1000 includes a high-dielectric-constant material film 4, an antireflection film 10, and a pinning film 9 on the back surface side of the semiconductor substrate 1000*b* (the upper portion of the semiconductor substrate 1000*b*), which is the side at which light enters the photoelectric conversion unit (the PDs 5-1 and 5-2). As shown in FIG. 13, the lid portion 1-2 of the light blocking unit 1, the high-dielectric-constant material film 4, the antireflection film 10, and the pinning film 9 are arranged in this order from the light incident side (the upper portion in FIG. 13).

In the solid-state imaging device 1000, a metallic region that shields the memory unit (MEM) 6 from light is continuously and widely disposed in the pixel region. Therefore, there are cases where distortions occur in an interface of or inside the semiconductor substrate 1000*b* (the P$^+$-layer 7 (the P-type semiconductor region) and the N$^-$-type layer 8 (the N-type semiconductor region)) due to a stress difference from the high-dielectric-constant material film (insulating film) 4 as a lower layer, and the distortions cause degradation of the dark characteristics.

Figure 14:
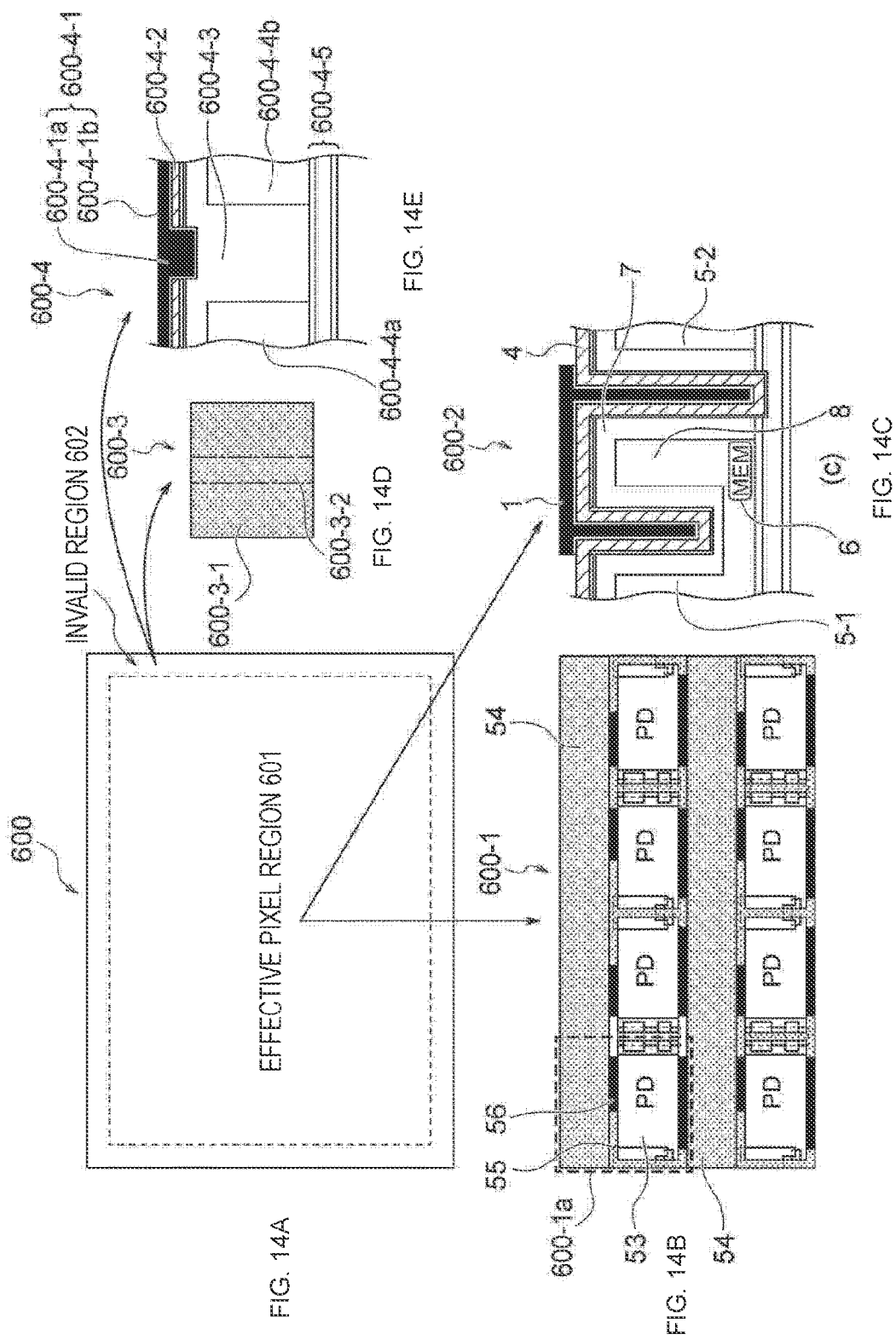
FIGS. 14A, 14B, 14C, 14D, and 14E are diagrams showing an example configuration of a solid-state imaging device.

FIG. 14(*a*) shows an effective pixel region 601 and an invalid region 602 in a solid-state imaging device 600. FIG. 14(*b*) is an enlarged plan view (bird's-eye view) (an effective pixel region 600-1) of eight pixels in the effective pixel region 601 as viewed from the light incident side. A pixel 600-1*a* shown in FIG. 14(*b*) represents one pixel. FIG. 14(*c*) is an enlarged sectional view (an effective pixel region 600-2) in the peripheral portion of the memory unit 6 in the effective pixel region 501. FIG. 14(*d*) is an enlarged plan view (bird's-eye view) (an invalid region 600-3) of the invalid region 602 as viewed from the light incident side. FIG. 14(*e*) is an enlarged sectional view (an invalid region 600-4) of the invalid region 602.

As shown in FIG. 14(*e*), in the invalid region 600-4, a light blocking metal 600-4-1 includes an embedded portion 600-4-1*a* and a lid portion 600-4-1*b*. Referring to FIG. 14(*d*) (an enlarged plan view seen from the light incident side), an embedded portion 600-3-2 (corresponding to 600-4-1*a* in FIG. 14(*e*)) is located substantially at the center of a lid portion 600-3-1 (corresponding to 600-4-1*b* in FIG. 14(*e*)).

The lid portion 600-4-1*b* is formed substantially parallel to a semiconductor substrate that includes a P$^+$-layer 600-4-3 (a P-type semiconductor region) and N$^-$-layers 600-4-4*a* and 600-4-4*b* (N-type semiconductor regions). The embedded portion 600-4-1*a* is formed by digging the high-dielectric-constant material film 4 and the P$^+$-layer (silicon layer) 7 in this order, starting from a lower portion of the lid portion 600-4-1*b*. That is, the embedded portion (light blocking metal) 600-4-1*a* and the P$^+$-layer (silicon layer) 600-4-3 can be brought into contact (connected), and be dropped to the ground (GND). To maintain the electrical stability of the light blocking unit 1 (the light blocking metal), the light blocking metal 600-4-1 and the silicon P$^+$-layer 600-4-3 are connected by the invalid region 602 outside the effective pixel region 601 (or outside the angle of view), and are dropped to the ground (GND).

Referring to FIG. 14(*c*), on the other hand, the light blocking unit 1 and the P$^+$-layer (silicon layer) 7 are not in contact with each other (not connected). Therefore, the light blocking unit 1 and the P$^+$-layer 7 cannot be continuous and cannot be dropped to the ground (GND).

The present technology has been developed in view of the above circumstances. Having a structure (a recessed structure) specific to a solid-state imaging device according to the present technology, a solid-state imaging device according to the present technology prevents distortions due to a stress difference between a light blocking unit (a light blocking metal) and the layer under the light blocking unit (a layer on the opposite side from the light incident side, and a layer on the front surface side of a conductive substrate when viewed from the light blocking unit) (such as a high-dielectric-constant material film, for example), and thus prevents degradation of dark characteristics, the stress difference being generated by the structure (the light blocking unit) that shields a memory unit (MEM) from light with a metal, for example. Further, in the solid-state imaging device according to the present technology, the structure (the recessed structure such as a light blocking metal, for example) specific to a solid-state imaging device according to the present technology and a silicon layer (a P$^+$-layer, for example) are connected (are brought into contact with each other) and are dropped to the ground, so that the value of the dark characteristics can be maintained at the same value in the effective pixel region.

In the description below, embodiments according to the present technology are described in detail.

2. First Embodiment (Example 1 of a Solid-State Imaging Device)

A solid-state imaging device of a first embodiment (Example 1 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the first embodiment according to the present technology may include one recessed structure, or may include a plurality of recessed structures.

The solid-state imaging device of the first embodiment according to the present technology includes at least a high-dielectric-constant material film on the back surface side of the semiconductor substrate, which is the side at which light enters the photoelectric conversion unit. In the solid-state imaging device of the first embodiment according to the present technology, the lid portion and the high-dielectric-constant material film are arranged in this order from the light incident side, and at least one recessed structure is formed by digging the high-dielectric-constant material film, starting from a lower portion of the lid portion.

With the solid-state imaging device of the first embodiment according to the present technology, image quality becomes higher. Specifically, in the solid-state imaging device of the first embodiment according to the present technology, at least one recessed structure is formed by digging the high-dielectric-constant material film, starting from the lower portion of the lid portion. Thus, planar continuous stress application onto the high-dielectric-constant material film (an oxide film, for example) and the light blocking unit (which may be formed with a light blocking metal, for example) can be alleviated, and the dark characteristics of the solid-state imaging device of the first embodiment according to the present technology can be improved.

FIG. 1(a) shows a cross-sectional view of a solid-state imaging device 10 of the first embodiment according to the present technology. Specifically, FIG. 1(a) shows in detail a peripheral portion of a memory unit 6 included in the solid-state imaging device 10 as a cross-sectional view. Note that the solid-state imaging device 10 of the first embodiment according to the present technology is a so-called back-illuminated CMOS image sensor in which a wiring layer (not shown) is disposed on the front surface side (the lower side in FIG. 1(a)) of a semiconductor substrate 10b, and light is made to enter the back surface side (the upper side in FIG. 1(a)) of the semiconductor substrate 10b.

As shown in FIG. 1(a), a light blocking unit 1 includes: a lid portion 1-2 disposed to cover the memory unit (MEM) 6; an embedded portion 1-1 that is disposed between a PD 5-1 and the memory unit 6, extends in the semiconductor substrate 10b, and is embedded in a vertical groove; and an embedded portion 1-3 that is disposed between a PD 5-2 and the memory unit 6, extends in the semiconductor substrate 10b (a P$^+$-layer 7 (a P-type semiconductor region) and an N-layer 8 (an N-type semiconductor region)), and is embedded in a vertical groove. The lid portion 1-2 is formed substantially parallel to the semiconductor substrate 10b, and the embedded portions 1-1 and 1-3 are designed to reach a predetermined depth so as to extend in a direction substantially orthogonal to the lid portion 1-2. Being formed in a transfer region that serves as a transfer path for transferring electric charges from the PD 5-1 to the memory unit 6, the embedded portion 1-1 (the first embedded portion) does not penetrate the semiconductor substrate 10b. On the other hand, not being formed in the transfer region that serves as the transfer path for transferring electric charges from the PD 5-1 to the memory unit 6 (or being formed outside the transfer region), the embedded portion 1-3 (the second embedded portion) may penetrate the semiconductor substrate 10b. In FIG. 1(a), the embedded portion 1-3 penetrates the semiconductor substrate 10b and reaches an insulating film (an oxide film) 11 that insulates the front surface side (the side opposite from the light incident side) of the semiconductor substrate 10b. Note that the memory to which the electric charges generated in the PD 5-2 are to be transferred is not shown in FIG. 1(a), but is the memory unit (MEM) disposed on the right side of the PD 5-2.

The solid-state imaging device 10 includes a high-dielectric-constant material film 4, an antireflection film 10, and a pinning film 9 on the back surface side of the semiconductor substrate 10b (the upper portion of the semiconductor substrate 10b), which is the side at which light enters the photoelectric conversion unit (the PDs 5-1 and 5-2). As shown in FIG. 1(a), the lid portion 1-2 of the light blocking unit 1, the high-dielectric-constant material film 4, the antireflection film 10, and the pinning film 9 are arranged in this order from the light incident side (the upper portion in FIG. 1(a)).

Referring to FIG. 1(a), the light blocking unit 1 (the embedded portion 1-1 and the embedded portion 1-3) is embedded in the high-dielectric-constant material film 4. For example, the light blocking unit 1 (the embedded portion 1-1, the embedded portion 1-3, and the lid portion 1-2) includes a material such as tungsten (W), aluminum (Al), or copper (Cu). Meanwhile, the high-dielectric-constant material film 4 includes a material such as silicon dioxide ($SiO_2$), hafnium oxide ($HfO_2$), tantalum pentoxide ($Ta_2O_5$), or zirconium dioxide ($ZrO_2$), for example.

A recessed structure 2 is formed between the embedded portion 1-1 and the embedded portion 1-3 in the embedding direction of the embedded portion 1-1 and the embedded portion 1-3, by digging. That is, the recessed structure 2 is formed by digging the high-dielectric-constant material film 4, starting from the lower portion of the lid portion 1-2. The recessed structure 2 may include a material similar to the material of the light blocking unit 1, and may include a material such as tungsten (W), aluminum (Al), or copper (Cu), as mentioned above. Further, like the light blocking unit 1, the recessed structure 2 may have a barrier metal 13 (Ti, TiN, WN, or the like, for example) covering the surface of the material such as tungsten (W).

As shown in FIG. 1(a), as the recessed structure 2 is formed in the solid-state imaging device 10, continuous planar stress application onto the high-dielectric-constant material film 4 and the light blocking unit 1 (particularly, the lid portion 1-2) can be alleviated, and thus, the dark characteristics of the solid-state imaging device 10 can be improved.

3. Second Embodiment (Example 2 of a Solid-State Imaging Device)

A solid-state imaging device of a second embodiment (Example 2 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate, and a silicon layer is included in the semiconductor substrate. The light blocking unit includes a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the second embodiment according to the present technology may include one recessed structure, or may include a plurality of recessed structures.

The solid-state imaging device of the second embodiment according to the present technology includes at least a high-dielectric-constant material film on the back surface side of the semiconductor substrate, which is the side at which light enters the photoelectric conversion unit. In the solid-state imaging device of the first embodiment according to the present technology, the lid portion and the high-dielectric-constant material film are arranged in this order from the light incident side, and at least one recessed structure is formed by digging the high-dielectric-constant material film and the silicon layer in this order, starting from a lower portion of the lid portion. The silicon layer may be a $P^+$-layer.

With the solid-state imaging device of the second embodiment according to the present technology, image quality becomes higher. Specifically, in the solid-state imaging device of the second embodiment according to the present technology, at least one recessed structure is formed by digging the high-dielectric-constant material film and the silicon layer (a $P^+$-layer, for example), starting from the lower portion of the lid portion. Thus, planar continuous stress application onto the high-dielectric-constant material film (an oxide film, for example) and the light blocking unit (which may be formed with a light blocking metal, for example) can be alleviated, and the dark characteristics of the solid-state imaging device of the second embodiment according to the present technology can be improved.

FIG. 1(b) shows a cross-sectional view of a solid-state imaging device 20 of the second embodiment according to the present technology. Specifically, FIG. 1(b) shows in detail a peripheral portion of a memory unit 6 included in the solid-state imaging device 20 as a cross-sectional view. Note that the solid-state imaging device 20 of the first embodiment according to the present technology is a so-called back-illuminated CMOS image sensor in which a wiring layer (not shown) is disposed on the front surface side (the lower side in FIG. 1(b)) of a semiconductor substrate 20b, and light is made to enter the back surface side (the upper side in FIG. 1(b)) of the semiconductor substrate 20b.

As shown in FIG. 1(b), a light blocking unit 1 includes: a lid portion 1-2 disposed to cover the memory unit (MEM) 6; an embedded portion 1-1 that is disposed between a PD 5-1 and the memory unit 6, extends in the semiconductor substrate 20b, and is embedded in a vertical groove; and an embedded portion 1-3 that is disposed between a PD 5-2 and the memory unit 6, extends in the semiconductor substrate 20b (a $P^+$-layer 7 (a P-type semiconductor region) and an N-layer 8 (an N-type semiconductor region)), and is embedded in a vertical groove. The lid portion 1-2 is formed substantially parallel to the semiconductor substrate 20b, and the embedded portions 1-1 and 1-3 are designed to reach a predetermined depth so as to extend in a direction substantially orthogonal to the lid portion 1-2. Being formed in a transfer region that serves as a transfer path for transferring electric charges from the PD 5-1 to the memory unit 6, the embedded portion 1-1 (the first embedded portion) does not penetrate the semiconductor substrate 20b. On the other hand, not being formed in the transfer region that serves as the transfer path for transferring electric charges from the PD 5-1 to the memory unit 6 (or being formed outside the transfer region), the embedded portion 1-3 (the second embedded portion) may penetrate the semiconductor substrate 20b. In FIG. 1(b), the embedded portion 1-3 penetrates the semiconductor substrate 20b and reaches an insulating film (an oxide film) 11 that insulates the front surface side (the side opposite from the light incident side) of the semiconductor substrate 20b. Note that the memory to which the electric charges generated in the PD 5-2 are to be transferred is not shown in FIG. 1(b), but is the memory unit (MEM) disposed on the right side of the PD 5-2.

The solid-state imaging device 20 includes a high-dielectric-constant material film 4, an antireflection film 10, and a pinning film 9 on the back surface side of the semiconductor substrate 20b (the upper portion of the semiconductor substrate 20b), which is the side at which light enters the photoelectric conversion unit (the PDs 5-1 and 5-2). As shown in FIG. 1(b), the lid portion 1-2 of the light blocking unit 1, the high-dielectric-constant material film 4, the antireflection film 10, and the pinning film 9 are arranged in this order from the light incident side (the upper portion in FIG. 1(b)).

Referring to FIG. 1(b), the light blocking unit 1 (the embedded portion 1-1 and the embedded portion 1-3) is embedded in the high-dielectric-constant material film 4. For example, the light blocking unit 1 (the embedded portion 1-1, the embedded portion 1-3, and the lid portion 1-2) includes a material such as tungsten (W), aluminum (Al), or copper (Cu). Meanwhile, the high-dielectric-constant material film 4 includes a material such as silicon dioxide ($SiO_2$), hafnium oxide ($HfO_2$), tantalum pentoxide ($Ta_2O_5$), or zirconium dioxide ($ZrO_2$), for example.

A recessed structure 3 is formed between the embedded portion 1-1 and the embedded portion 1-3 in the embedding direction of the embedded portion 1-1 and the embedded portion 1-3, by digging. Specifically, the recessed structure 3 is formed by digging the high-dielectric-constant material film 4, the PT layer 10, the pinning film 9, and the $P^+$-layer (silicon layer) 7 in this order, starting from a lower portion of the lid portion 1-2. The recessed structure 3 may include a material similar to the material of the light blocking unit 1, and may include a material such as tungsten (W), aluminum (Al), or copper (Cu), as mentioned above. Further, like the light blocking unit 1, the recessed structure 3 may have a barrier metal 13 (Ti, TiN, WN, or the like, for example) covering the surface of the material such as tungsten (W).

As shown in FIG. 1(b), as the recessed structure 3 is formed in the solid-state imaging device 20, continuous planar stress application onto the high-dielectric-constant material film 4 and the light blocking unit 1 (particularly, the lid portion 1-2) can be alleviated, and thus, the dark characteristics of the solid-state imaging device 20 can be improved.

Figure 7A:
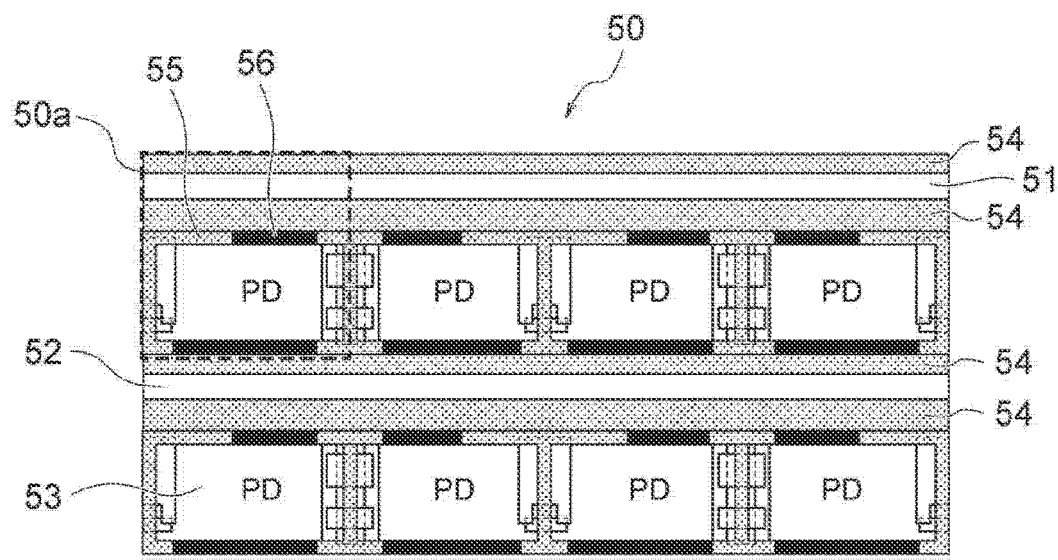
FIGS. 7A and 7B are plan views of example configurations of solid-state imaging devices to which the present technology is applied.

Next, FIG. 7(a) shows a plan view of a solid-state imaging device 50 of the second embodiment according to the present technology. Specifically, FIG. 7(a) shows eight pixels (four pixels (rows)×two pixels (columns)) of the solid-state imaging device 50. FIG. 7(a) is a bird's-eye view of the recessed structure 2 or the recessed structure 3 shown in FIGS. 1A and 1B, for example, of the eight pixels of the solid-state imaging device 50, as viewed from the light incident side.

The solid-state imaging device 50 is now described in detail, with reference to a pixel 50a as one pixel. The pixel 50a includes: a light blocking unit including a lid portion 54 and embedded portions 55 and 56: a memory unit (not shown); a (linear) recessed structure 51 that is continuous between plurality of pixels; and a PD 53. As described above with reference to FIGS. 1A and 1B, the memory unit is located below the lid portion 54 of the light blocking unit, and therefore, the memory unit is not shown. The embedded portion 55 (a gray region in FIG. 7(a)) does not penetrate the semiconductor substrate (silicon), but the embedded portion 56 (a black region in FIG. 7(a)) penetrates the semiconductor substrate (silicon). That is, electric charges generated in the PD 53 are transferred to the memory unit (not shown) via the embedded portion 55.

The continuous (linear) recessed structures 51 are continuously disposed between the plurality of pixels in the row direction (four pixels are shown in FIG. 7(a)), and a group of recessed structures is formed.

Figure 7B:
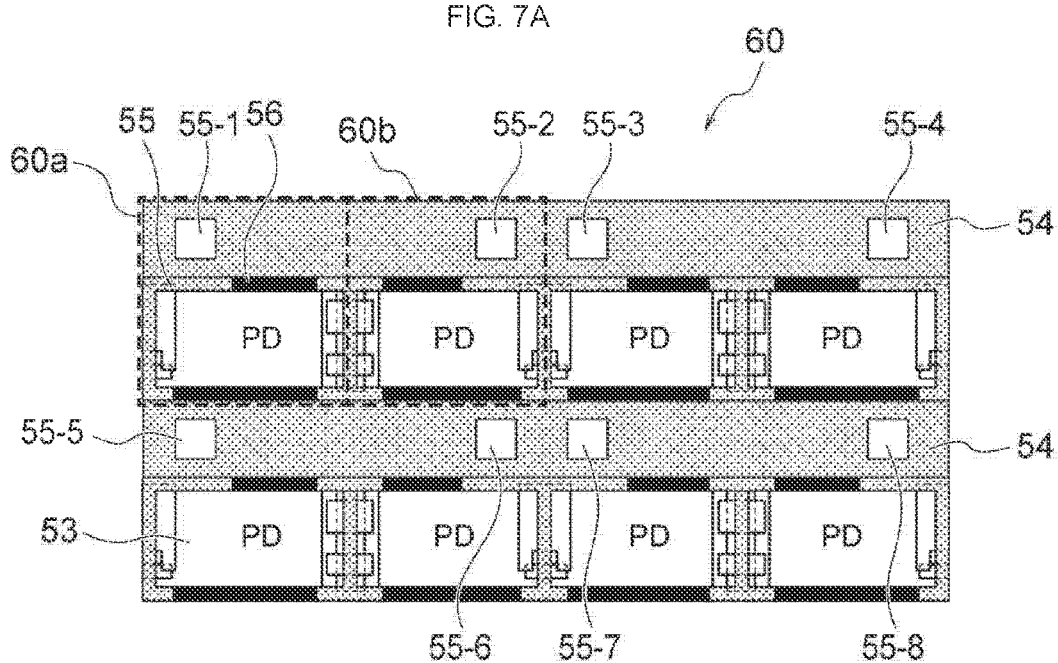

FIG. 7(b) shows a plan view of a solid-state imaging device 60 of the second embodiment according to the present technology. Specifically, FIG. 7(b) shows eight pixels (four pixels (rows)×two pixels (columns)) of the solid-state imaging device 60. FIG. 7(b) is a bird's-eye view of the recessed structure 2 or the recessed structure 3 shown in FIGS. 1A and 1B, for example, of the eight pixels of the solid-state imaging device 60, as viewed from the light incident side.

The solid-state imaging device 60 is now described in detail, with reference to a pixel 60a. The pixel 60a includes: a light blocking unit including a lid portion 54 and embedded portions 55 and 56: a memory unit (not shown); a recessed structure 55-1; and a PD 53. In the solid-state imaging device 60, the recessed structures are included discontinuously for the respective pixels. Since eight pixels are shown in FIG. 7(b), a total of eight recessed structures (recessed structures 55-1 to 55-8) are shown in FIG. 7(b). As described above with reference to FIGS. 1A and 1B, the memory unit is located below the lid portion 54 of the light blocking unit, and therefore, the memory unit is not shown. The embedded portion 55 (a gray region in FIG. 7(a)) does not penetrate the semiconductor substrate (silicon), but the embedded portion 56 (a black region in FIG. 7(a)) penetrates the semiconductor substrate (silicon). That is, electric charges generated in the PD 53 are transferred to the memory unit (not shown) via the embedded portion 55.

The discontinuous recessed structures 55-1 to 55-8 are disposed discontinuously for the respective pixels, to form a group of recessed structures. The group of recessed structures (a collective recessed structure of the discontinuous recessed structures 55-1 to 55-8) is disposed in conformity with the symmetry of the pixels. Here, symmetry means that, in a case where the pixels are arranged symmetrically like the pixel 60a and a pixel 60b, the recessed structures 55-1 and 55-2 are also arranged symmetrically.

FIG. 9(a) shows an effective pixel region 501 and an invalid region 502 in a solid-state imaging device 500 of the second embodiment according to the present technology. FIG. 9(b) is an enlarged plan view (bird's-eye view) of the recessed structure 2 or the recessed structure 3 shown in FIGS. 1A and 1B, for example, of eight pixels of the effective pixel region 501 (an effective pixel region 500-1), as viewed from the light incident side. FIG. 9(c) is a cross-sectional view taken along the A-B line defined in FIG. 9(b), and is an enlarged sectional view (an effective pixel region 500-2) in the peripheral portion of the memory unit 6 in the effective pixel region 501. The A side and the B side of the A-B line shown in FIG. 9(b) correspond to the A side and the B side shown in FIG. 9(C). FIG. 9(d) is an enlarged plan view (bird's-eye view) (an invalid region 500-3) of the invalid region 502 as viewed from the light incident side. FIG. 9(e) is an enlarged sectional view (an invalid region 500-4) of the invalid region 502.

As shown in FIG. 9(e), in the invalid region 600-4, a light blocking metal 500-4-1 includes an embedded portion 500-4-1a and a lid portion 500-4-1b. Referring to FIG. 9(d) (an enlarged plan view seen from the light incident side), an embedded portion 500-3-2 (corresponding to 500-4-1a in FIG. 9(e)) is located substantially at the center of a lid portion 500-3-1 (corresponding to 500-4-1b in FIG. 9(e)).

The lid portion 500-4-1b is formed substantially parallel to a semiconductor substrate that includes a P$^+$-layer 500-4-3 (a P-type semiconductor region) and N$^-$-layers 500-4-4a and 500-4-4b (N-type semiconductor regions). The embedded portion 500-4-1a is formed by digging a high-dielectric-constant material film 500-4-2 and a P$^+$-layer (silicon layer) 500-4-3 in this order, starting from a lower portion of the lid portion 500-4-1b. That is, the embedded portion (light blocking metal) 500-4-1a and the P$^+$-layer (silicon layer) 500-4-3 can be brought into contact (connected) and be made continuous, and can be dropped to the ground (GND). To maintain the electrical stability of the light blocking unit 1 (the light blocking metal), the light blocking metal 500-4-1 and the silicon P$^+$-layer 500-4-3 are connected and made continuous by the invalid region 502 outside the effective pixel region 501 (or outside the angle of view), and are dropped to the ground (GND).

Further, referring to FIG. 9(c), since the recessed structure 3 and the P$^+$-layer (silicon layer) 7 are also in contact (connected) with each other and are continuous, each pixel of the effective pixel region 501 can be dropped to the ground (GND). As a result, in the solid-state imaging device of the second embodiment according to the present technology, the dark characteristics value can be kept uniform in the effective pixel region.

Figure 10:
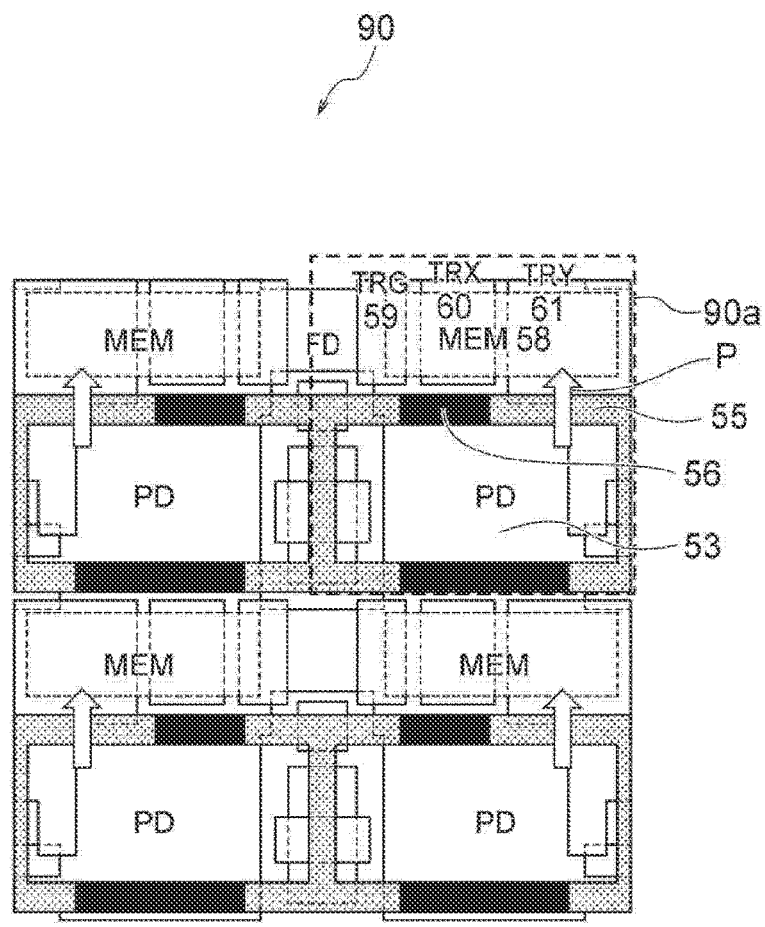
FIG. 10 is a diagram for explaining the configuration of a solid-state imaging device to which the present technology is applied.

Referring now to FIG. 10, a solid-state imaging device of the second embodiment according to the present technology is described. FIG. 10 is a planar layout diagram of the semiconductor substrate (PDs) and the gates. FIG. 10 shows four pixels of a solid-state imaging device 90. The solid-state imaging device 90 is now described in detail, with reference to a pixel 90a.

The pixel 90a includes at least a PD 53, a memory unit (MEM) 58, a TRX gate 60, a TRG gate 59, a TRY gate 61, and an embedded portion 55 (a gray region in FIG. 10) and an embedded portion 56 (a black region in FIG. 10) of the light blocking unit.

The embedded portion 55 (a gray region in FIG. 10) does not penetrate the semiconductor substrate (silicon), but the embedded portion 56 (a black region in FIG. 10) penetrates the semiconductor substrate (silicon). That is, electric charges generated in the PD 53 are transferred in the direction of an arrow P to the memory unit 58 via the embedded portion 55. Meanwhile, the TRX gate 60 is provided to control the transfer of electric charges from the PD 53 to the memory unit 58. The TRG gate 59 is provided to transfer electric charges from the memory unit 58 to the floating diffusion region (FD). Note that the floating diffusion region (FD) is shared between the pixel 90a and the pixel to the left in FIG. 10. The TRY gate 61 is provided to prevent backflow of electric charges from the region of the memory unit 58 to the region of the PD 53.

FIGS. 11A, 11B, 11C, 11D, and 12 are cross-sectional views showing examples of methods for manufacturing a solid-state imaging device of the second embodiment according to the present technology. In the description below, examples of methods for manufacturing a solid-state imaging device of the second embodiment according to the present technology are explained with reference to FIGS. 11A, 11B, 11C, 11D, and 12.

First, an example of a method for manufacturing a solid-state imaging device of the second embodiment according to the present technology is described with reference to FIG. 11.

In FIG. 11(a), a PD 704, a memory unit 702, a gate 701, and a wiring layer 700 are stacked on a Si substrate (semiconductor substrate) 705 in this order from the front surface side (the side opposite from the light incident side).

In FIG. 11(b), after the stack formed in FIG. 11(a) is turned upside down, a support substrate 706 (which may be a logic substrate) is bonded to the stack, and the Si substrate (semiconductor substrate) 705 (and a P$^+$-layer 703) is made thinner.

In FIG. 11(c), the Si substrate (semiconductor substrate) 705 (and the P$^+$-layer 703) is dug to form vertical groove portions 710 to 712, and a pinning film 709, an antireflection film 708, and a high-dielectric-constant material film 707 are formed in this order. The high-dielectric-constant material film 707 is stacked and is flattened by the atomic layer deposition (ALD) method.

In FIG. 11(d), the high-dielectric-constant material film 707, the antireflection film 708, the pinning film 709, and the $P^+$-layer 703 above the memory unit 702 are dug in this order with a photoresist and etching to form a recess 713.

Figure 12:
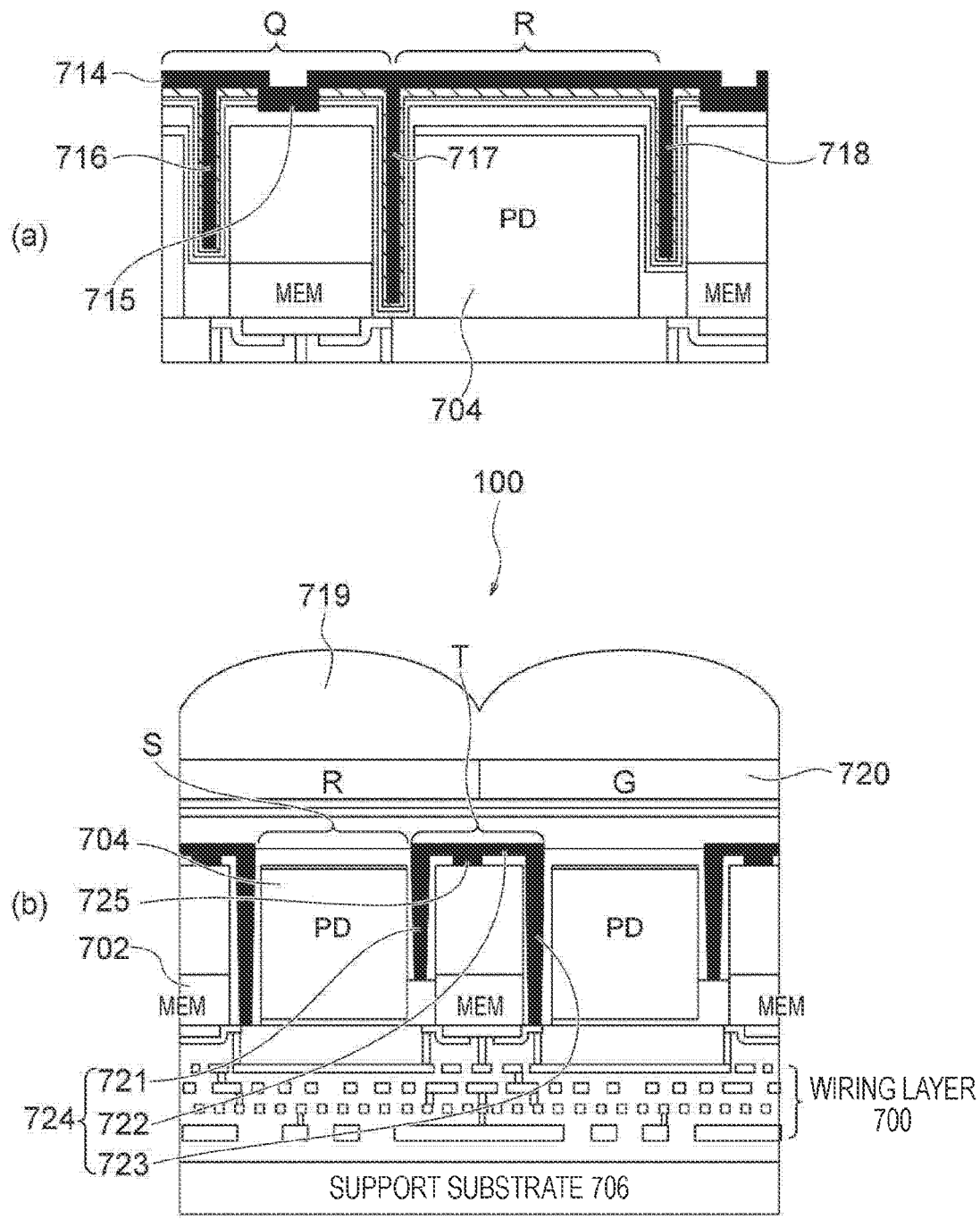
FIG. 12 is cross-sectional views showing an example method for manufacturing a solid-state imaging device to which the present technology is applied.

Next, an example of a method for manufacturing a solid-state imaging device of the second embodiment according to the present technology is described with reference to FIG. 12.

In FIG. 12(a), a metal (tungsten, for example) is formed into a film by the chemical vapor deposition (CVD) method, and a lid portion 714 and embedded portions 716 to 718 of the light blocking unit, and a recessed structure 715 are formed. With a photoresist and etching, an upper portion of a PD 704 is then opened, to form an opening region R for light entrance. Note that the region that shields the memory unit 702 from light is indicated by a light blocking region T.

Lastly, in FIG. 12(b), a color filter layer 720 and an on-chip lens 719 are stacked in this order by a conventional method. Thus, a solid-state imaging device 100 that includes a light blocking unit 724 (including a lid portion 722 and embedded portions 721 and 723) and a recessed structure 725 is manufactured.

Note that the above described methods for manufacturing a solid-state imaging device of the second embodiment according to the present technology may be used for manufacturing a solid-state imaging device of the first embodiment according to the present technology and solid-state imaging devices of third to eighth embodiments according to the present technology described later.

4. Third Embodiment (Example 3 of a Solid-State Imaging Device)

A solid-state imaging device of a third embodiment (Example 3 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate, and a silicon layer is included in the semiconductor substrate. The light blocking unit includes a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the second embodiment according to the present technology may include one recessed structure, or may include a plurality of recessed structures. The at least one recessed structure included in the solid-state imaging device of the third embodiment according to the present technology is wider than the at least one recessed structure included a solid-state imaging device of the second embodiment according to the present technology, for example.

The solid-state imaging device of the third embodiment according to the present technology includes at least a high-dielectric-constant material film on the back surface side of the semiconductor substrate, which is the side at which light enters the photoelectric conversion unit. In the solid-state imaging device of the third embodiment according to the present technology, the lid portion and the high-dielectric-constant material film are arranged in this order from the light incident side, and at least one recessed structure is formed by digging the high-dielectric-constant material film and the silicon layer in this order, starting from a lower portion of the lid portion. The silicon layer may be a $P^+$-layer.

With the solid-state imaging device of the third embodiment according to the present technology, image quality becomes higher. Specifically, in the solid-state imaging device of the third embodiment according to the present technology, at least one recessed structure is formed by digging the high-dielectric-constant material film and the silicon layer (a $P^+$-layer, for example) starting from the lower portion of the lid portion, and the at least one recessed structure is wide. Thus, planar continuous stress application onto the high-dielectric-constant material film (an oxide film, for example) and the light blocking unit (which may be formed with a light blocking metal, for example) can be alleviated, and the dark characteristics of the solid-state imaging device of the third embodiment according to the present technology can be improved.

FIG. 2(a) shows a cross-sectional view of a solid-state imaging device 30 of the third embodiment according to the present technology. Specifically, FIG. 2(a) shows in detail a peripheral portion of a memory unit 6 included in the solid-state imaging device 30 as a cross-sectional view. Note that the solid-state imaging device 30 of the third embodiment according to the present technology is a so-called back-illuminated CMOS image sensor in which a wiring layer (not shown) is disposed on the front surface side (the lower side in FIG. 2(a)) of a semiconductor substrate 30b, and light is made to enter the back surface side (the upper side in FIG. 2(a)) of the semiconductor substrate 30b.

As shown in FIG. 2(a), a light blocking unit 1 includes: a lid portion 1-2 disposed to cover the memory unit (MEM) 6; an embedded portion 1-1 that is disposed between a PD 5-1 and the memory unit 6, extends in the semiconductor substrate 30b, and is embedded in a vertical groove; and an embedded portion 1-3 that is disposed between a PD 5-2 and the memory unit 6, extends in the semiconductor substrate 30b (a $P^+$-layer 7 (a P-type semiconductor region) and an N-layer 8 (an N-type semiconductor region)), and is embedded in a vertical groove. The lid portion 1-2 is formed substantially parallel to the semiconductor substrate 30b, and the embedded portions 1-1 and 1-3 are designed to reach a predetermined depth so as to extend in a direction substantially orthogonal to the lid portion 1-2. Being formed in a transfer region that serves as a transfer path for transferring electric charges from the PD 5-1 to the memory unit 6, the embedded portion 1-1 (the first embedded portion) does not penetrate the semiconductor substrate 30b. On the other hand, not being formed in the transfer region that serves as the transfer path for transferring electric charges from the PD 5-1 to the memory unit 6 (or being formed outside the transfer region), the embedded portion 1-3 (the second embedded portion) may penetrate the semiconductor substrate 30b. In FIG. 2(a), the embedded portion 1-3 penetrates the semiconductor substrate 30b and reaches an insulating film (an oxide film) 11 that insulates the front surface side (the side opposite from the light incident side) of the semiconductor substrate 30b. Note that the memory to which the electric charges generated in the PD 5-2 are to be transferred is not shown in FIG. 2(a), but is the memory unit (MEM) disposed on the right side of the PD 5-2.

The solid-state imaging device 30 includes a high-dielectric-constant material film 4, an antireflection film 10, and a pinning film 9 on the back surface side of the semiconductor substrate 30b (the upper portion of the semiconductor substrate 30b), which is the side at which light enters the photoelectric conversion unit (the PDs 5-1 and 5-2). As shown in FIG. 2(a), the lid portion 1-2 of the light blocking unit 1, the high-dielectric-constant material film 4, the antireflection film 10, and the pinning film 9 are arranged in this order from the light incident side (the upper portion in FIG. 2(a)).

Referring to FIG. 2(a), the light blocking unit 1 (the embedded portion 1-1 and the embedded portion 1-3) is embedded in the high-dielectric-constant material film 4. For example, the light blocking unit 1 (the embedded portion 1-1, the embedded portion 1-3, and the lid portion 1-2) includes a material such as tungsten (W), aluminum (Al), or copper (Cu). Meanwhile, the high-dielectric-constant material film 4 includes a material such as silicon dioxide ($SiO_2$), hafnium oxide ($HfO_2$), tantalum pentoxide ($Ta_2O_5$), or zirconium dioxide ($ZrO_2$), for example.

A recessed structure 14 is formed between the embedded portion 1-1 and the embedded portion 1-3 in the embedding direction of the embedded portion 1-1 and the embedded portion 1-3, by digging. Specifically, the recessed structure 14 is formed by digging the high-dielectric-constant material film 4, the PT layer 10, the pinning film 9, and the $P^+$-layer (silicon layer) 7 in this order, starting from a lower portion of the lid portion 1-2. The width of the recessed structure 14 (the length in the transverse direction in FIG. 2(a)) is greater than the width of the recessed structure 3 (the length in the transverse direction in FIG. 1(b)), and the width of the recessed structure 14 is substantially equal to the length from the pinning film 9 at the right end of the high-dielectric-constant material film 4 covering the embedded portion 1-1 to the pinning film 9 at the left end of the high-dielectric-constant material film 4 covering the embedded portion 1-3. The recessed structure 14 may include a material similar to the material of the light blocking unit 1, and may include a material such as tungsten (W), aluminum (Al), or copper (Cu), as mentioned above. Further, like the light blocking unit 1, the recessed structure 14 may have a barrier metal 13 (Ti, TiN, WN, or the like, for example) covering the surface of the material such as tungsten (W).

As shown in FIG. 2(a), as the wide recessed structure 14 is formed in the solid-state imaging device 30, continuous planar stress application onto the high-dielectric-constant material film 4 and the light blocking unit 1 (particularly, the lid portion 1-2) can be alleviated, and thus, the dark characteristics of the solid-state imaging device 30 can be improved.

FIG. 2(b) shows a cross-sectional view of a solid-state imaging device 40 of the third embodiment according to the present technology. Specifically, FIG. 2(b) shows in detail a peripheral portion of a memory unit 6 included in the solid-state imaging device 40 as a cross-sectional view. Note that the solid-state imaging device 40 of the third embodiment according to the present technology is a so-called back-illuminated CMOS image sensor in which a wiring layer (not shown) is disposed on the front surface side (the lower side in FIG. 2(b)) of a semiconductor substrate 40b, and light is made to enter the back surface side (the upper side in FIG. 2(b)) of the semiconductor substrate 40b.

As shown in FIG. 2(b), a light blocking unit 1 includes: a lid portion 1-2 disposed to cover the memory unit (MEM) 6; an embedded portion 1-1 that is disposed between a PD 5-1 and the memory unit 6, extends in the semiconductor substrate 40b, and is embedded in a vertical groove; and an embedded portion 1-3 that is disposed between a PD 5-2 and the memory unit 6, extends in the semiconductor substrate 40b (a $P^+$-layer 7 (a P-type semiconductor region) and an N-layer 8 (an N-type semiconductor region)), and is embedded in a vertical groove. The lid portion 1-2 is formed substantially parallel to the semiconductor substrate 40b, and the embedded portions 1-1 and 1-3 are designed to reach a predetermined depth so as to extend in a direction substantially orthogonal to the lid portion 1-2. Being formed in a transfer region that serves as a transfer path for transferring electric charges from the PD 5-1 to the memory unit 6, the embedded portion 1-1 (the first embedded portion) does not penetrate the semiconductor substrate 40b. On the other hand, not being formed in the transfer region that serves as the transfer path for transferring electric charges from the PD 5-1 to the memory unit 6 (or being formed outside the transfer region), the embedded portion 1-3 (the second embedded portion) may penetrate the semiconductor substrate 40b. In FIG. 2(b), the embedded portion 1-3 penetrates the semiconductor substrate 40b and reaches an insulating film (an oxide film) 11 that insulates the front surface side (the side opposite from the light incident side) of the semiconductor substrate 40b. Note that the memory to which the electric charges generated in the PD 5-2 are to be transferred is not shown in FIG. 2(b), but is the memory unit (MEM) disposed on the right side of the PD 5-2.

The solid-state imaging device 40 includes a high-dielectric-constant material film 4, an antireflection film 10, and a pinning film 9 on the back surface side of the semiconductor substrate 40b (the upper portion of the semiconductor substrate 40b), which is the side at which light enters the photoelectric conversion unit (the PDs 5-1 and 5-2). As shown in FIG. 2(b), the lid portion 1-2 of the light blocking unit 1, the high-dielectric-constant material film 4, the antireflection film 10, and the pinning film 9 are arranged in this order from the light incident side (the upper portion in FIG. 2(b)).

Referring to FIG. 2(b), the light blocking unit 1 (the embedded portion 1-1 and the embedded portion 1-3) is embedded in the high-dielectric-constant material film 4. For example, the light blocking unit 1 (the embedded portion 1-1, the embedded portion 1-3, and the lid portion 1-2) includes a material such as tungsten (W), aluminum (Al), or copper (Cu). Meanwhile, the high-dielectric-constant material film 4 includes a material such as silicon dioxide ($SiO_2$), hafnium oxide ($HfO_2$), tantalum pentoxide ($Ta_2O_5$), or zirconium dioxide ($ZrO_2$), for example.

A recessed structure 15 is formed between the embedded portion 1-1 and the embedded portion 1-3 in the embedding direction of the embedded portion 1-1 and the embedded portion 1-3, by digging. Specifically, the recessed structure 15 is formed by digging the high-dielectric-constant material film 4, the PT layer 10, the pinning film 9, and the $P^+$-layer (silicon layer) 7 in this order, starting from a lower portion of the lid portion 1-2. The width of the recessed structure 15 (the length in the transverse direction in FIG. 2(b)) is greater than the width of the above described recessed structure 3 (the length in the transverse direction in FIG. 1(b)) and the width of the above described recessed structure 14 (the length in the transverse direction in FIG. 2(a)), and the width of the recessed structure 15 is substantially equal to the length from the right end of the embedded portion 1-1 to the left end of the embedded portion 1-3. The recessed structure 15 may include a material similar to the material of the light blocking unit 1, and may include a material such as tungsten (W), aluminum (Al), or copper (Cu), as mentioned above. Further, like the light blocking unit 1, the recessed structure 15 may have a barrier metal 13 (Ti, TiN, WN, or the like, for example) covering the surface of the material such as tungsten (W).

As shown in FIG. 2(b), as the wide recessed structure 15 is formed in the solid-state imaging device 40, continuous planar stress application onto the high-dielectric-constant material film 4 and the light blocking unit 1 (particularly, the lid portion 1-2) can be alleviated, and thus, the dark characteristics of the solid-state imaging device 30 can be improved.

Figure 8A:
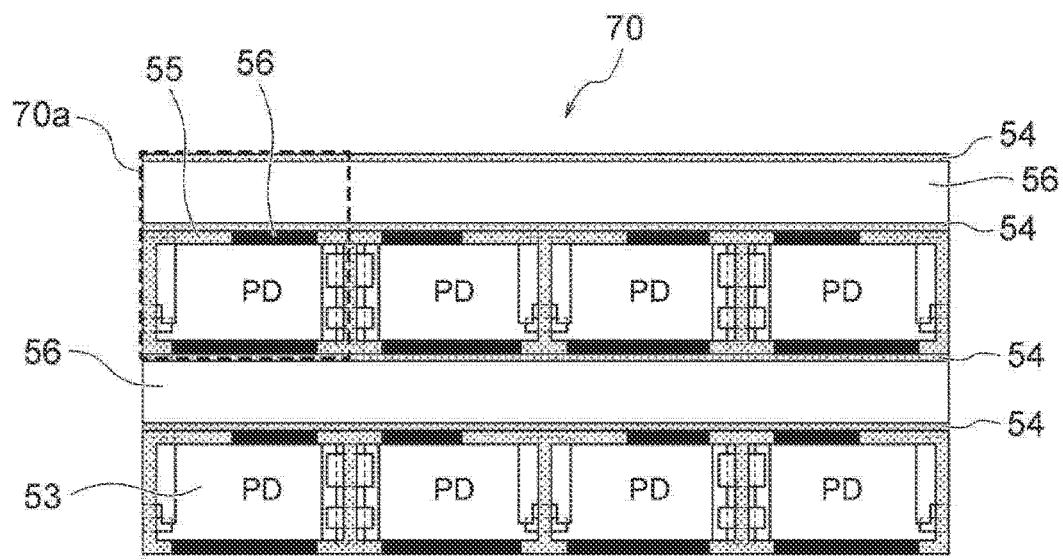
FIGS. 8A and 8B are plan views of example configurations of solid-state imaging devices to which the present technology is applied.

FIG. 8(a) shows a plan view of a solid-state imaging device 70 of the third embodiment according to the present technology. Specifically, FIG. 8(a) shows eight pixels (four pixels (rows)×two pixels (columns)) of the solid-state imaging device 70. FIG. 8(a) is a bird's-eye view of the recessed structure 14 or the recessed structure 15 shown in FIGS. 2A and 2B, or more specifically, the recessed structure 15 shown in FIG. 2(b), for example, of eight pixels of the solid-state imaging device 70, as viewed from the light incident side (the upper side in FIGS. 2A and 2B)).

The solid-state imaging device 70 is now described in detail, with reference to a pixel 70a. The pixel 70a includes: a light blocking unit including a lid portion 54 and embedded portions 55 and 56: a memory unit (not shown); a (linear) recessed structure 56 that is wide and is continuous between plurality of pixels; and a PD 53. As described above with reference to FIG. 2(a), the memory unit is located below the lid portion 54 of the light blocking unit, and therefore, the memory unit is not shown. The embedded portion 55 (a gray region in FIG. 8(a)) does not penetrate the semiconductor substrate (silicon), but the embedded portion 56 (a black region in FIG. 8(a)) penetrates the semiconductor substrate (silicon). That is, electric charges generated in the PD 53 are transferred to the memory unit (not shown) via the embedded portion 55.

The wide and continuous (linear) recessed structures 56 are continuously disposed between the plurality of pixels in the row direction (four pixels are shown in FIG. 8(a)), and a group of recessed structures is formed.

Figure 8B:
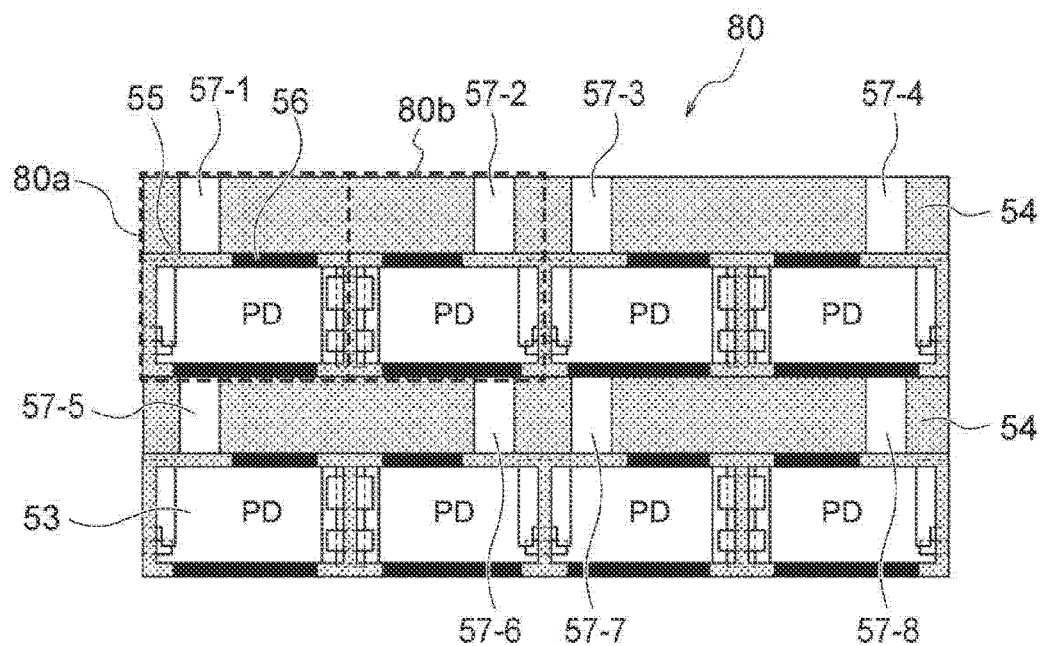

FIG. 8(b) shows a plan view of a solid-state imaging device 80 of the third embodiment according to the present technology. Specifically, FIG. 8(b) shows eight pixels (four pixels (rows)×two pixels (columns)) of the solid-state imaging device 80. FIG. 8(b) is a bird's-eye view of the recessed structure 15 shown in FIG. 2(b), for example, of the eight pixels of the solid-state imaging device 80, as viewed from the light incident side (the upper side in FIG. 2(b)).

The solid-state imaging device 80 is now described in detail, with reference to a pixel 80a. The pixel 80a includes: a light blocking unit including a lid portion 54 and embedded portions 55 and 56: a memory unit (not shown); a wide recessed structure 57-1; and a PD 53. In the solid-state imaging device 80, the wide recessed structures are included discontinuously for the respective pixels. Since eight pixels are shown in FIG. 8(b), a total of eight wide recessed structures (wide recessed structures 57-1 to 57-8) are shown in FIG. 7(b). As described above with reference to FIG. 2(b), the memory unit is located below the lid portion 54 of the light blocking unit, and therefore, the memory unit is not shown. The embedded portion 55 (a gray region in FIG. 8(b)) does not penetrate the semiconductor substrate (silicon), but the embedded portion 56 (a black region in FIG. 8(b)) penetrates the semiconductor substrate (silicon). That is, electric charges generated in the PD 53 are transferred to the memory unit (not shown) via the embedded portion 55.

The wide recessed structures 57-1 to 57-8 are disposed discontinuously for the respective pixels, to form a group of recessed structures. The group of recessed structures (a collective recessed structure of the wide and discontinuous recessed structures 57-1 to 57-8) is disposed in conformity with the symmetry of the pixels. Here, symmetry means that, in a case where the pixels are arranged symmetrically like the pixel 80a and a pixel 80b, the recessed structures 57-1 and 57-2 are also arranged symmetrically.

Note that, other than the aspects described above, the contents described in the chapters for solid-state imaging devices of the first and second embodiments according to the present technology (including the contents of the description of the drawings) can be applied, without any change, to a solid-state imaging device of the third embodiment according to the present technology.

5. Fourth Embodiment (Example 4 of a Solid-State Imaging Device)

A solid-state imaging device of a fourth embodiment (Example 4 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the first embodiment according to the present technology may include one recessed structure, or may include a plurality of recessed structures. The at least one recessed structure included in the solid-state imaging device of the fourth embodiment according to the present technology is wider than the at least one recessed structure included a solid-state imaging device of the first embodiment according to the present technology, for example.

The solid-state imaging device of the fourth embodiment according to the present technology includes at least a high-dielectric-constant material film on the back surface side of the semiconductor substrate, which is the side at which light enters the photoelectric conversion unit. In the solid-state imaging device of the first embodiment according to the present technology, the lid portion and the high-dielectric-constant material film are arranged in this order from the light incident side, and at least one recessed structure is formed by digging the high-dielectric-constant material film, starting from a lower portion of the lid portion.

With the solid-state imaging device of the fourth embodiment according to the present technology, image quality becomes higher. Specifically, in the solid-state imaging device of the fourth embodiment according to the present technology, at least one recessed structure is formed by digging the high-dielectric-constant material film starting from the lower portion of the lid portion, and the at least one recessed structure is wide. Thus, planar continuous stress application onto the high-dielectric-constant material film (an oxide film, for example) and the light blocking unit (which may be formed with a light blocking metal, for example) can be alleviated, and the dark characteristics of the solid-state imaging device of the fourth embodiment according to the present technology can be improved.

FIG. 3(a) shows a cross-sectional view of a solid-state imaging device 30A of the fourth embodiment according to the present technology. Specifically, FIG. 3(a) shows in detail a peripheral portion of a memory unit 6 included in the solid-state imaging device 30A as a cross-sectional view. Note that the solid-state imaging device 30A of the fourth embodiment according to the present technology is a so-called back-illuminated CMOS image sensor in which a wiring layer (not shown) is disposed on the front surface side (the lower side in FIG. 3(a)) of a semiconductor substrate 30b, and light is made to enter the back surface side (the upper side in FIG. 3(a)) of the semiconductor substrate 30b.

A recessed structure 140 is formed between the embedded portion 1-1 and the embedded portion 1-3 in the embedding direction of the embedded portion 1-1 and the embedded portion 1-3, by digging. That is, the recessed structure 14 is formed by digging the high-dielectric-constant material film 4, starting from the lower portion of the lid portion 1-2. The width of the recessed structure 140 (the length in the transverse direction in FIG. 2(a)) is greater than the width of the recessed structure 3 (the length in the transverse direction in FIG. 1(b)), and the width of the recessed structure 140 is substantially equal to the length from the right end of the high-dielectric-constant material film 4 covering the embedded portion 1-1 to the left end of the high-dielectric-constant material film 4 covering the embedded portion 1-3. The recessed structure 140 may include a material similar to the material of the light blocking unit 1, and may include a material such as tungsten (W), aluminum (Al), or copper (Cu), as mentioned above. Further, like the light blocking unit 1, the recessed structure 140 may have a barrier metal 13 (Ti, TiN, WN, or the like, for example) covering the surface of the material such as tungsten (W).

As shown in FIG. 3(a), as the wide recessed structure 140 is formed in the solid-state imaging device 30A, continuous planar stress application onto the high-dielectric-constant material film 4 and the light blocking unit 1 (particularly, the lid portion 1-2) can be alleviated, and thus, the dark characteristics of the solid-state imaging device 30A can be improved.

FIG. 3(b) shows a cross-sectional view of a solid-state imaging device 40A of the fourth embodiment according to the present technology. Specifically, FIG. 3(b) shows in detail a peripheral portion of a memory unit 6 included in the solid-state imaging device 40A as a cross-sectional view. Note that the solid-state imaging device 40A of the fourth embodiment according to the present technology is a so-called back-illuminated CMOS image sensor in which a wiring layer (not shown) is disposed on the front surface side (the lower side in FIG. 3(b)) of a semiconductor substrate 40b, and light is made to enter the back surface side (the upper side in FIG. 3(b)) of the semiconductor substrate 40b.

A recessed structure 150 is formed between the embedded portion 1-1 and the embedded portion 1-3 in the embedding direction of the embedded portion 1-1 and the embedded portion 1-3, by digging. That is, the recessed structure 15 is formed by digging the high-dielectric-constant material film 4, starting from the lower portion of the lid portion 1-2. The width of the recessed structure 150 (the length in the transverse direction in FIG. 3(b)) is greater than the width of the above described recessed structure 3 (the length in the transverse direction in FIG. 1(b)) and the width of the above described recessed structure 140 (the length in the transverse direction in FIG. 3(a)), and the width of the recessed structure 150 is substantially equal to the length from the right end of the embedded portion 1-1 to the left end of the embedded portion 1-3. The recessed structure 150 may include a material similar to the material of the light blocking unit 1, and may include a material such as tungsten (W), aluminum (Al), or copper (Cu), as mentioned above. Further, like the light blocking unit 1, the recessed structure 150 may have a barrier metal 13 (Ti, TiN, WN, or the like, for example) covering the surface of the material such as tungsten (W).

As shown in FIG. 3(b), as the wide recessed structure 150 is formed in the solid-state imaging device 40A, continuous planar stress application onto the high-dielectric-constant material film 4 and the light blocking unit 1 (particularly, the lid portion 1-2) can be alleviated, and thus, the dark characteristics of the solid-state imaging device 40A can be improved.

Note that, other than the aspects described above, the contents described in the chapters for solid-state imaging devices of the first to third embodiments according to the present technology (Including the contents of the description of the drawings) can be applied, without any change, to a solid-state imaging device of the fourth embodiment according to the present technology.

6. Fifth Embodiment (Example 5 of a Solid-State Imaging Device)

A solid-state imaging device of a fifth embodiment (Example 5 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the fifth embodiment according to the present technology may include one recessed structure, or may include a plurality of recessed structures.

The solid-state imaging device of the fifth embodiment according to the present technology includes at least a high-dielectric-constant material film and an antireflection film on the back surface side of the semiconductor substrate, which is the side at which light enters the photoelectric conversion unit. In the solid-state imaging device of the fifth embodiment according to the present technology, the lid portion, the high-dielectric-constant material film, and the antireflection film are arranged in this order from the light incident side, and at least one recessed structure is formed by digging the high-dielectric-constant material film and the antireflection film, starting from a lower portion of the lid portion.

With the solid-state imaging device of the fifth embodiment according to the present technology, image quality becomes higher. Specifically, in the solid-state imaging device of the fifth embodiment according to the present technology, at least one recessed structure is formed by digging the high-dielectric-constant material film and the antireflection film, starting from the lower portion of the lid portion. Thus, planar continuous stress application onto the high-dielectric-constant material film (an oxide film, for example), the light blocking unit (which may be formed with a light blocking metal, for example), and the antireflection film can be alleviated, and the dark characteristics of the solid-state imaging device of the fifth embodiment according to the present technology can be improved.

Figures 4A, 4B:
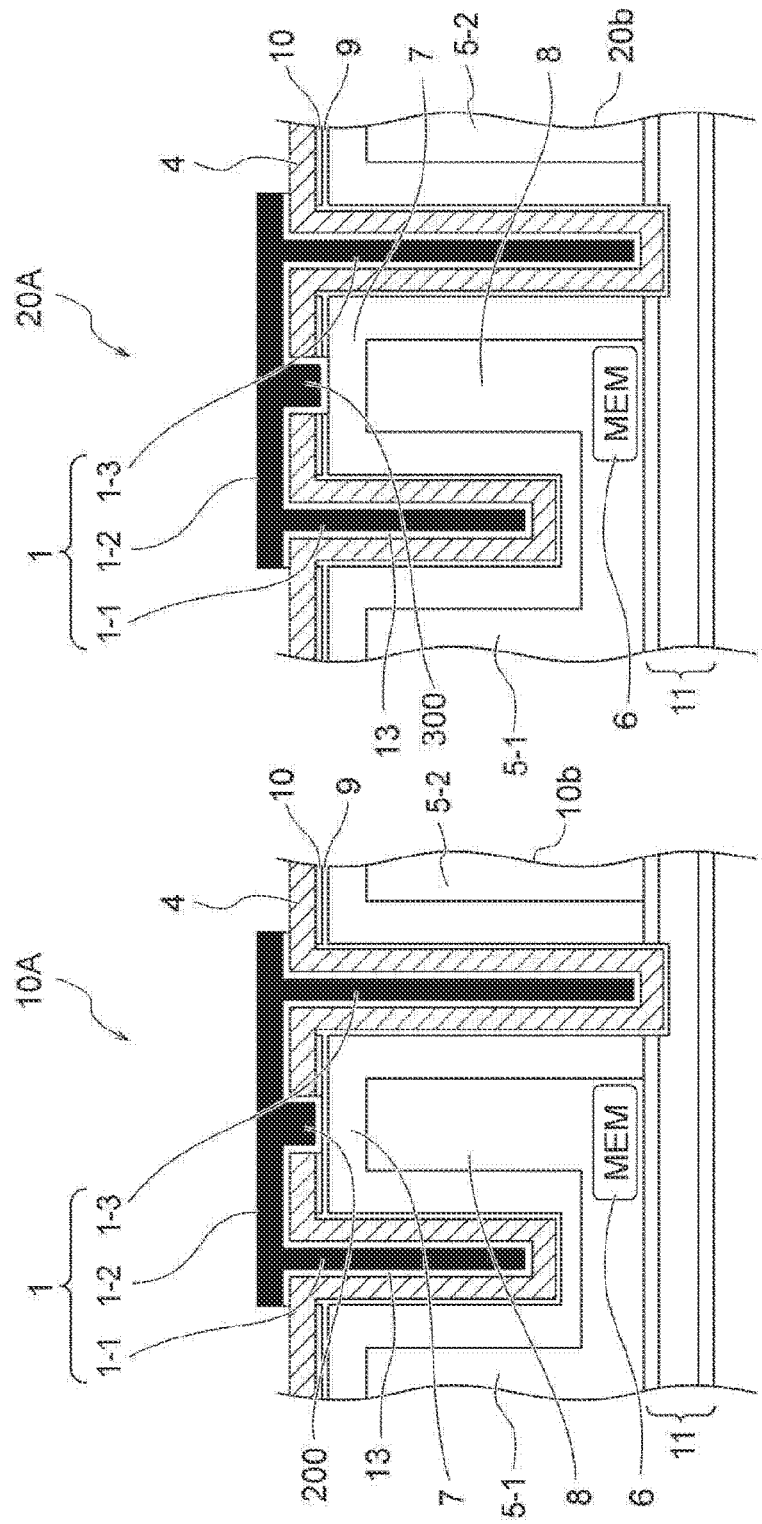
FIGS. 4A and 4B are cross-sectional views of example configurations of solid-state imaging devices to which the present technology is applied.

FIG. 4(a) shows a cross-sectional view of a solid-state imaging device 10A of the fifth embodiment according to the present technology. Specifically, FIG. 4(a) shows in detail a peripheral portion of a memory unit 6 included in the solid-state imaging device 10A as a cross-sectional view. Note that the solid-state imaging device 10A of the fifth embodiment according to the present technology is a so-called back-illuminated CMOS image sensor in which a wiring layer (not shown) is disposed on the front surface side (the lower side in FIG. 4(a)) of a semiconductor substrate 10b, and light is made to enter the back surface side (the upper side in FIG. 4(a)) of the semiconductor substrate 10b.

As shown in FIG. 4(a), a recessed structure 200 is formed between the embedded portion 1-1 and the embedded portion 1-3 in the embedding direction of the embedded portion 1-1 and the embedded portion 1-3, by digging. That is, the recessed structure 200 is formed by digging the high-dielectric-constant material film 4 and an antireflection film 10, starting from the lower portion of the lid portion 1-2. The recessed structure 200 may include a material similar to the material of the light blocking unit 1, and may include a material such as tungsten (W), aluminum (Al), or copper (Cu), as mentioned above. Further, like the light blocking unit 1, the recessed structure 200 may have a barrier metal 13 (Ti, TiN, WN, or the like, for example) covering the surface of the material such as tungsten (W).

As shown in FIG. 4(a), as the recessed structure 200 is formed in the solid-state imaging device 10A, continuous planar stress application onto the high-dielectric-constant material film 4, the light blocking unit 1 (particularly, the lid portion 1-2), and the antireflection film 10 can be alleviated, and thus, the dark characteristics of the solid-state imaging device 10A can be improved.

Note that, other than the aspects described above, the contents described in the chapters for solid-state imaging devices of the first and second embodiments according to the present technology can be applied, without any change, to a solid-state imaging device of the fifth embodiment according to the present technology.

7. Sixth Embodiment (Example 6 of a Solid-State Imaging Device)

A solid-state imaging device of a sixth embodiment (Example 6 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the fifth embodiment according to the present technology may include one recessed structure, or may include a plurality of recessed structures.

The solid-state imaging device of the sixth embodiment according to the present technology includes at least a high-dielectric-constant material film, an antireflection film, and a pinning film on the back surface side of the semiconductor substrate, which is the side at which light enters the photoelectric conversion unit. In the solid-state imaging device of the sixth embodiment according to the present technology, the lid portion, the high-dielectric-constant material film, the antireflection film, and the pinning film are arranged in this order from the light incident side, and at least one recessed structure is formed by digging the high-dielectric-constant material film, the antireflection film, and the pinning film, starting from a lower portion of the lid portion.

With the solid-state imaging device of the sixth embodiment according to the present technology, image quality becomes higher. Specifically, in the solid-state imaging device of the sixth embodiment according to the present technology, at least one recessed structure is formed by digging the high-dielectric-constant material film, the antireflection film, and the pinning film, starting from the lower portion of the lid portion. Thus, planar continuous stress application onto the high-dielectric-constant material film (an oxide film, for example), the light blocking unit (which may be formed with a light blocking metal, for example), the antireflection film, and the pinning film can be alleviated, and the dark characteristics of the solid-state imaging device of the sixth embodiment according to the present technology can be improved.

FIG. 4(b) shows a cross-sectional view of a solid-state imaging device 20A of the sixth embodiment according to the present technology. Specifically, FIG. 4(b) shows in detail a peripheral portion of a memory unit 6 included in the solid-state imaging device 20A as a cross-sectional view. Note that the solid-state imaging device 20A of the first embodiment according to the present technology is a so-called back-illuminated CMOS image sensor in which a wiring layer (not shown) is disposed on the front surface side (the lower side in FIG. 4(b)) of a semiconductor substrate 10b, and light is made to enter the back surface side (the upper side in FIG. 4(b)) of the semiconductor substrate 10b.

As shown in FIG. 4(b), a recessed structure 300 is formed between the embedded portion 1-1 and the embedded portion 1-3 in the embedding direction of the embedded portion 1-1 and the embedded portion 1-3, by digging. That is, the recessed structure 300 is formed by digging the high-dielectric-constant material film 4, an antireflection film 10, and a pinning film 9, starting from the lower portion of the lid portion 1-2. The recessed structure 300 may include a material similar to the material of the light blocking unit 1, and may include a material such as tungsten (W), aluminum (Al), or copper (Cu), as mentioned above. Further, like the light blocking unit 1, the recessed structure 300 may have a barrier metal 13 (Ti, TiN, WN, or the like, for example) covering the surface of the material such as tungsten (W).

As shown in FIG. 4(b), as the recessed structure 300 is formed in the solid-state imaging device 20A, continuous planar stress application onto the high-dielectric-constant material film 4, the light blocking unit 1 (particularly, the lid portion 1-2), the antireflection film 10, and the pinning film 9 can be alleviated, and thus, the dark characteristics of the solid-state imaging device 20A can be improved.

Note that, other than the aspects described above, the contents described in the chapters for solid-state imaging devices of the first and second embodiments according to the present technology can be applied, without any change, to a solid-state imaging device of the sixth embodiment according to the present technology.

8. Seventh Embodiment (Example 7 of a Solid-State Imaging Device)

A solid-state imaging device of a seventh embodiment (Example 7 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the seventh embodiment according to the present technology may include one recessed structure, or may include a plurality of recessed structures. The at least one recessed structure included in the solid-state imaging device of the seventh embodiment according to the present technology is wider than the at least one recessed structure included a solid-state imaging device of the fifth embodiment according to the present technology, for example.

The solid-state imaging device of the seventh embodiment according to the present technology includes at least a high-dielectric-constant material film and an antireflection film on the back surface side of the semiconductor substrate, which is the side at which light enters the photoelectric conversion unit. In the solid-state imaging device of the fifth embodiment according to the present technology, the lid portion, the high-dielectric-constant material film, and the antireflection film are arranged in this order from the light incident side, and at least one recessed structure is formed by digging the high-dielectric-constant material film and the antireflection film, starting from a lower portion of the lid portion.

With the solid-state imaging device of the seventh embodiment according to the present technology, image quality becomes higher. Specifically, in the solid-state imaging device of the seventh embodiment according to the present technology, at least one recessed structure is formed by digging the high-dielectric-constant material film and the antireflection film starting from the lower portion of the lid portion, and the at least one recessed structure is wide. Thus, planar continuous stress application onto the high-dielectric-constant material film (an oxide film, for example), the light blocking unit (which may be formed with a light blocking metal, for example), and the antireflection film can be alleviated, and the dark characteristics of the solid-state imaging device of the seventh embodiment according to the present technology can be improved.

FIG. 5(a) shows a cross-sectional view of a solid-state imaging device 30B of the seventh embodiment according to the present technology. Specifically, FIG. 5(a) shows in detail a peripheral portion of a memory unit 6 included in the solid-state imaging device 30B as a cross-sectional view. Note that the solid-state imaging device 30B of the seventh embodiment according to the present technology is a so-called back-illuminated CMOS image sensor in which a wiring layer (not shown) is disposed on the front surface side (the lower side in FIG. 5(a)) of a semiconductor substrate 30b, and light is made to enter the back surface side (the upper side in FIG. 5(a)) of the semiconductor substrate 30b.

A recessed structure 141 is formed between the embedded portion 1-1 and the embedded portion 1-3 in the embedding direction of the embedded portion 1-1 and the embedded portion 1-3, by digging. That is, the recessed structure 141 is formed by digging the high-dielectric-constant material film 4 and an antireflection film 10, starting from the lower portion of the lid portion 1-2. The width of the recessed structure 141 (the length in the transverse direction in FIG. 5(a)) is greater than the width of the recessed structure 3 (the length in the transverse direction in FIG. 1(b)), for example, and the width of the recessed structure 141 is substantially equal to the length from the pinning film 9 at the right end of the high-dielectric-constant material film 4 covering the embedded portion 1-1 to the pinning film 9 at the left end of the high-dielectric-constant material film 4 covering the embedded portion 1-3. The recessed structure 141 may include a material similar to the material of the light blocking unit 1, and may include a material such as tungsten (W), aluminum (Al), or copper (Cu), as mentioned above. Further, like the light blocking unit 1, the recessed structure 140 may have a barrier metal 13 (Ti, TiN, WN, or the like, for example) covering the surface of the material such as tungsten (W).

As shown in FIG. 5(a), as the wide recessed structure 141 is formed in the solid-state imaging device 30B, continuous planar stress application onto the high-dielectric-constant material film 4, the light blocking unit 1 (particularly, the lid portion 1-2), and the antireflection film 10 can be alleviated, and thus, the dark characteristics of the solid-state imaging device 30B can be improved.

FIG. 5(b) shows a cross-sectional view of a solid-state imaging device 40B of the seventh embodiment according to the present technology. Specifically, FIG. 5(b) shows in detail a peripheral portion of a memory unit 6 included in the solid-state imaging device 40B as a cross-sectional view. Note that the solid-state imaging device 40B of the seventh embodiment according to the present technology is a so-called back-illuminated CMOS image sensor in which a wiring layer (not shown) is disposed on the front surface side (the lower side in FIG. 5(b)) of a semiconductor substrate 40b, and light is made to enter the back surface side (the upper side in FIG. 5(b)) of the semiconductor substrate 40b.

A recessed structure 151 is formed between the embedded portion 1-1 and the embedded portion 1-3 in the embedding direction of the embedded portion 1-1 and the embedded portion 1-3, by digging. That is, the recessed structure 151 is formed by digging the high-dielectric-constant material film 4 and an antireflection film 10, starting from the lower portion of the lid portion 1-2. The width of the recessed structure 151 (the length in the transverse direction in FIG. 5(b)) is greater than the width of the above described recessed structure 3 (the length in the transverse direction in FIG. 1(b)) and the width of the above described recessed structure 141 (the length in the transverse direction in FIG. 5(a)), for example, and the width of the recessed structure 151 is substantially equal to the length from the right end of the embedded portion 1-1 to the left end of the embedded portion 1-3. The recessed structure 151 may include a material similar to the material of the light blocking unit 1, and may include a material such as tungsten (W), aluminum (Al), or copper (Cu), as mentioned above. Further, like the light blocking unit 1, the recessed structure 151 may have a barrier metal 13 (Ti, TiN, WN, or the like, for example) covering the surface of the material such as tungsten (W).

As shown in FIG. 5(b), as the wide recessed structure 151 is formed in the solid-state imaging device 40B, continuous planar stress application onto the high-dielectric-constant material film 4, the light blocking unit 1 (particularly, the lid portion 1-2), and the antireflection film 10 can be alleviated, and thus, the dark characteristics of the solid-state imaging device 40B can be improved.

Note that, other than the aspects described above, the contents described in the chapters for solid-state imaging devices of the first to third embodiments according to the present technology (Including the contents of the description of the drawings) can be applied, without any change, to a solid-state imaging device of the seventh embodiment according to the present technology.

9. Eighth Embodiment (Example 8 of a Solid-State Imaging Device)

A solid-state imaging device of an eighth embodiment (Example 8 of a solid-state imaging device) according to the present technology is a solid-state imaging device that includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the second embedded portion is disposed outside the transfer region. The lid portion of the light blocking unit formed on the back surface side of the semiconductor substrate, which is the side at which light to the memory unit enters, includes at least one recessed structure. The solid-state imaging device of the fifth embodiment according to the present technology may include one recessed structure, or may include a plurality of recessed structures. The at least one recessed structure included in the solid-state imaging device of the eighth embodiment according to the present technology is wider than the at least one recessed structure included a solid-state imaging device of the sixth embodiment according to the present technology, for example.

The solid-state imaging device of the eighth embodiment according to the present technology includes at least a high-dielectric-constant material film, an antireflection film, and a pinning film on the back surface side of the semiconductor substrate, which is the side at which light enters the photoelectric conversion unit. In the solid-state imaging device of the eighth embodiment according to the present technology, the lid portion, the high-dielectric-constant material film, the antireflection film, and the pinning film are arranged in this order from the light incident side, and at least one recessed structure is formed by digging the high-dielectric-constant material film, the antireflection film, and the pinning film, starting from a lower portion of the lid portion.

With the solid-state imaging device of the eighth embodiment according to the present technology, image quality becomes higher. Specifically, in the solid-state imaging device of the eighth embodiment according to the present technology, at least one recessed structure is formed by digging the high-dielectric-constant material film, the antireflection film, and the pinning film starting from the lower portion of the lid portion, and the at least one recessed structure is wide. Thus, planar continuous stress application onto the high-dielectric-constant material film (an oxide film, for example), the light blocking unit (which may be formed with a light blocking metal, for example), the antireflection film, and the pinning film can be alleviated, and the dark characteristics of the solid-state imaging device of the eighth embodiment according to the present technology can be improved.

FIG. 6(a) shows a cross-sectional view of a solid-state imaging device 30C of the eighth embodiment according to the present technology. Specifically, FIG. 6(a) shows in detail a peripheral portion of a memory unit 6 included in the solid-state imaging device 30C as a cross-sectional view. Note that the solid-state imaging device 30C of the eighth embodiment according to the present technology is a so-called back-illuminated CMOS image sensor in which a wiring layer (not shown) is disposed on the front surface side (the lower side in FIG. 6(a)) of a semiconductor substrate 30b, and light is made to enter the back surface side (the upper side in FIG. 6(a)) of the semiconductor substrate 30b.

A recessed structure 142 is formed between the embedded portion 1-1 and the embedded portion 1-3 in the embedding direction of the embedded portion 1-1 and the embedded portion 1-3, by digging. That is, the recessed structure 142 is formed by digging the high-dielectric-constant material film 4, an antireflection film 10, and a pinning film 9, starting from the lower portion of the lid portion 1-2. The width of the recessed structure 142 (the length in the transverse direction in FIG. 6(a)) is greater than the width of the recessed structure 3 (the length in the transverse direction in FIG. 1(b)), for example, and the width of the recessed structure 142 is substantially equal to the length from the pinning film 9 at the right end of the high-dielectric-constant material film 4 covering the embedded portion 1-1 to the pinning film 9 at the left end of the high-dielectric-constant material film 4 covering the embedded portion 1-3. The recessed structure 142 may include a material similar to the material of the light blocking unit 1, and may include a material such as tungsten (W), aluminum (Al), or copper (Cu), as mentioned above. Further, like the light blocking unit 1, the recessed structure 140 may have a barrier metal 13 (Ti, TiN, WN, or the like, for example) covering the surface of the material such as tungsten (W).

As shown in FIG. 6(a), as the wide recessed structure 142 is formed in the solid-state imaging device 30C, continuous planar stress application onto the high-dielectric-constant material film 4, the light blocking unit 1 (particularly, the lid portion 1-2), the antireflection film 10, and the pinning film 9 can be alleviated, and thus, the dark characteristics of the solid-state imaging device 30C can be improved.

FIG. 6(b) shows a cross-sectional view of a solid-state imaging device 40C of the eighth embodiment according to the present technology. Specifically, FIG. 6(b) shows in detail a peripheral portion of a memory unit 6 included in the solid-state imaging device 40C as a cross-sectional view. Note that the solid-state imaging device 40C of the eighth embodiment according to the present technology is a so-called back-illuminated CMOS image sensor in which a wiring layer (not shown) is disposed on the front surface side (the lower side in FIG. 6(b)) of a semiconductor substrate 40b, and light is made to enter the back surface side (the upper side in FIG. 6(b)) of the semiconductor substrate 40b.

A recessed structure 152 is formed between the embedded portion 1-1 and the embedded portion 1-3 in the embedding direction of the embedded portion 1-1 and the embedded portion 1-3, by digging. That is, the recessed structure 152 is formed by digging the high-dielectric-constant material film 4, an antireflection film 10, and a pinning film 9, starting from the lower portion of the lid portion 1-2. The width of the recessed structure 152 (the length in the transverse direction in FIG. 6(b)) is greater than the width of the above described recessed structure 3 (the length in the transverse direction in FIG. 1(b)) and the width of the above described recessed structure 142 (the length in the transverse direction in FIG. 6(a)), for example, and the width of the recessed structure 152 is substantially equal to the length from the right end of the embedded portion 1-1 to the left end of the embedded portion 1-3. The recessed structure 152 may include a material similar to the material of the light blocking unit 1, and may include a material such as tungsten (W), aluminum (Al), or copper (Cu), as mentioned above. Further, like the light blocking unit 1, the recessed structure 152 may have a barrier metal 13 (Ti, TiN, WN, or the like, for example) covering the surface of the material such as tungsten (W).

As shown in FIG. 6(b), as the wide recessed structure 152 is formed in the solid-state imaging device 40C, continuous planar stress application onto the high-dielectric-constant material film 4, the light blocking unit 1 (particularly, the lid portion 1-2), the antireflection film 10, and the pinning film 9 can be alleviated, and thus, the dark characteristics of the solid-state imaging device 40C can be improved.

Note that, other than the aspects described above, the contents described in the chapters for solid-state imaging devices of the first to third embodiments according to the present technology (Including the contents of the description of the drawings) can be applied, without any change, to a solid-state imaging device of the eighth embodiment according to the present technology.

10. Ninth Embodiment (Example of an Electronic Apparatus)

An electronic apparatus of a ninth embodiment according to the present technology is an electronic apparatus on which a solid-state imaging device is mounted, and the solid-state imaging device includes: a photoelectric conversion unit that converts received light into an electric charge; a memory unit that holds the electric charge transferred from the photoelectric conversion unit; and a light blocking unit that blocks light. The photoelectric conversion unit and the memory unit are formed in a semiconductor substrate. The light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit so as to extend in the semiconductor substrate. The first embedded portion is disposed in a transfer region for transferring the electric charge from the photoelectric conversion unit to the memory unit, and the lid portion of the light blocking unit formed on the back surface side of the semiconductor substrate, which is the side at which light to the memory unit enters, includes at least one recessed structure.

For example, the electronic apparatus of the ninth embodiment according to the present technology is an electronic apparatus on which a solid-state imaging device of one of the first to eighth embodiments according to the present technology is mounted.

Figure 15:
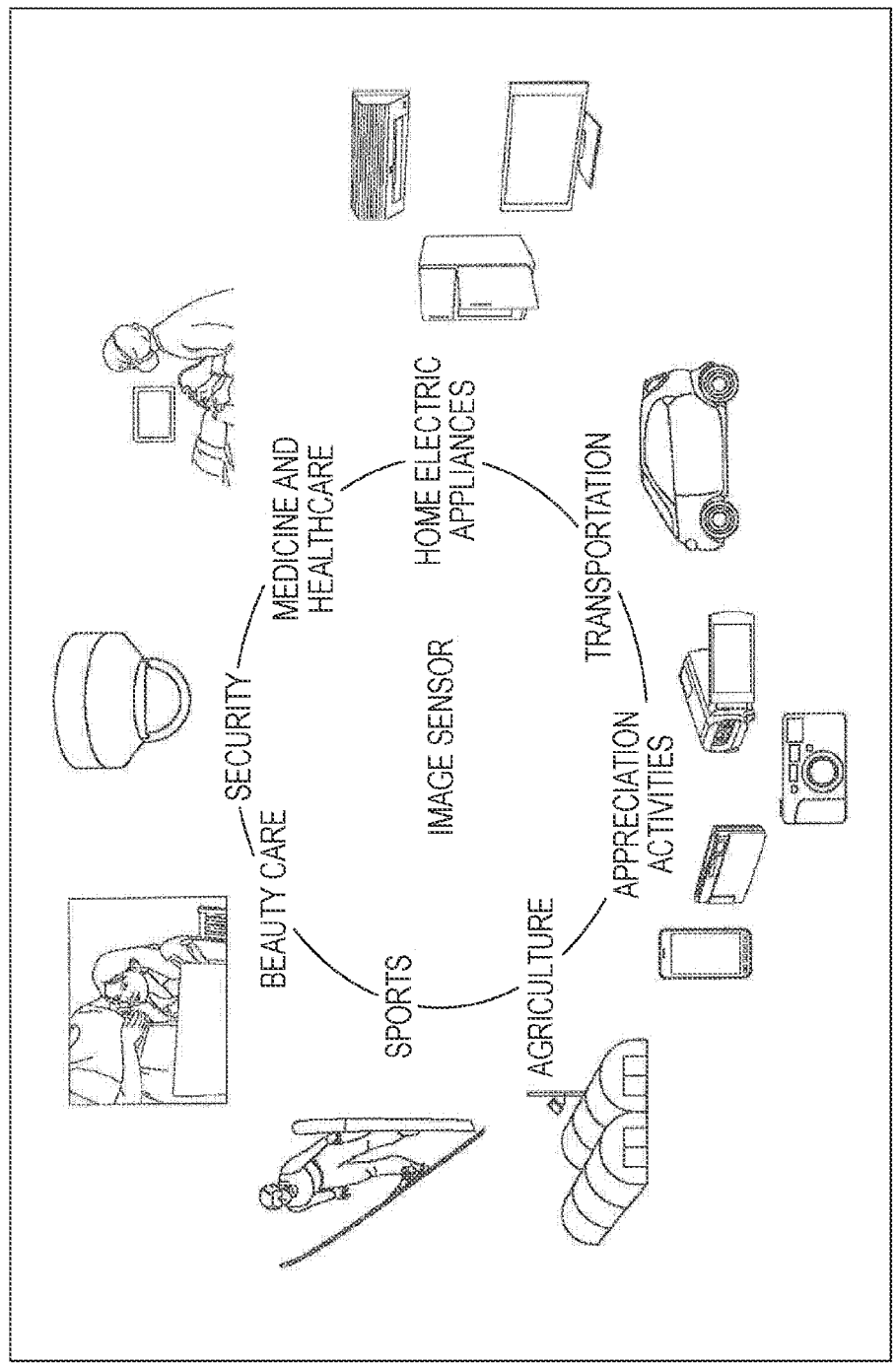
FIG. 15 is a diagram showing examples of use of solid-state imaging devices of first and second embodiments to which the present technology is applied.

11. Examples of Use of Solid-State Imaging Device to Which the Present Technology Is Applied FIG. 15 is a diagram showing examples of use of solid-state imaging devices of the first to eighth embodiments according to the present technology as image sensors.

Solid-state imaging devices of the first to eighth embodiments described above can be used in various cases where light such as visible light, infrared light, ultraviolet light, or an X-ray is sensed, as described below, for example. That is, as shown in FIG. 15, solid-state imaging devices of any one of the first to eighth embodiments can be used in apparatuses (such as the electronic apparatus of the ninth embodiment described above, for example) that are used in the appreciation activity field where images are taken and are used in appreciation activities, the field of transportation, the field of home electric appliances, the fields of medicine and healthcare, the field of security, the field of beauty care, the field of sports, the field of agriculture, and the like for example.

Specifically, in the appreciation activity field, a solid-state imaging device of any one of the first to eighth embodiments can be used in an apparatus for capturing images to be used in appreciation activities, such as a digital camera, a smartphone, or a portable telephone with a camera function, for example.

In the field of transportation, a solid-state imaging device of any one of the first to eighth embodiments can be used in an apparatus for transportation use, such as a vehicle-mounted sensor designed to capture images of the front, the back, the surroundings, the inside, and the like of an automobile, to perform safe driving such as an automatic stop and recognize the driver's condition or the like, a surveillance camera for monitoring running vehicles and roads, and a ranging sensor or the like for measuring distances between vehicles or the like, for example.

In the field of home electric appliances, a solid-state imaging device of any one of the first to eighth embodiments can be used in an apparatus to be used as home electric appliances, such as a television set, a refrigerator, or an air conditioner, to capture images of gestures of users and operate the apparatus in accordance with the gestures, for example.

In the fields of medicine and healthcare, a solid-state imaging device of any one of the first to eighth embodiments can be used in an apparatus for medical use or healthcare use, such as an endoscope or an apparatus for receiving infrared light for angiography, for example.

In the field of security, a solid-state imaging device of any one of the first to eighth embodiments can be used in an apparatus for security use, such as a surveillance camera for crime prevention or a camera for personal authentication, for example.

In the field of beauty care, a solid-state imaging device of any one of the first to eighth embodiments can be used in an apparatus for beauty care use, such as a skin measurement apparatus designed to capture images of the skin or a microscope for capturing images of the scalp, for example.

In the field of sports, a solid-state imaging device of any one of the first to eighth embodiments can be used in an apparatus for sporting use, such as an action camera or a wearable camera for sports or the like, for example.

In the field of agriculture, a solid-state imaging device of any one of the first to eighth embodiments can be used in an apparatus for agricultural use, such as a camera for monitoring conditions of fields and crops, for example.

Figure 16:
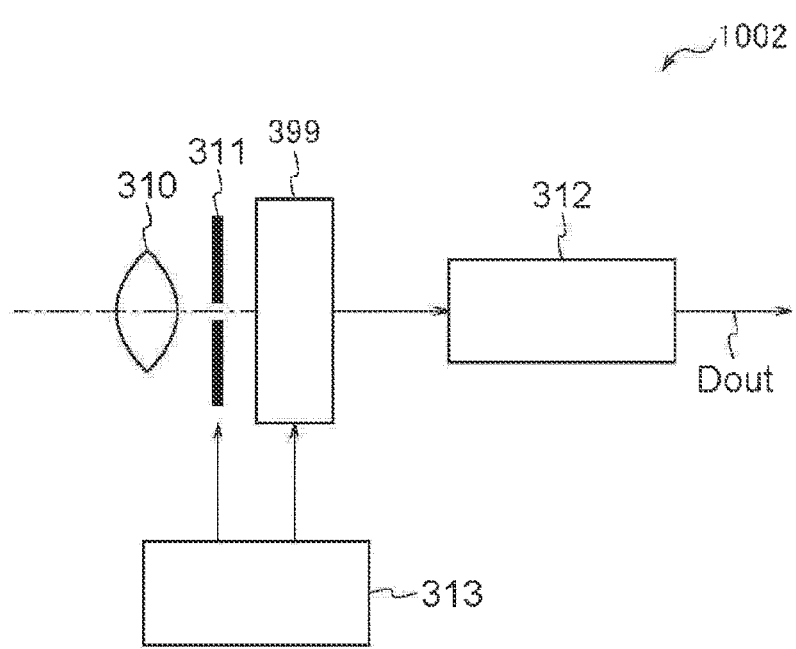
FIG. 16 is a functional block diagram of an example of an electronic apparatus according to a third embodiment to which the present technology is applied.

Next, an example of use of a solid-state imaging device of one of the first to eighth embodiments according to the present technology is specifically described. For example, a solid-state imaging device of any one of the first to eighth embodiments described above can be used as a solid-state imaging device 101 in an electronic apparatus of any type having an imaging function, such as a camera system like a digital still camera or a video camera, or a portable telephone having an imaging function. FIG. 16 shows a schematic configuration of an electronic apparatus 102 (a camera) as an example. This electronic apparatus 102 is a video camera capable of capturing a still image or a moving image, for example, and includes the solid-state imaging device 101, an optical system (an optical lens) 310, a shutter device 311, a drive unit 313 that drives the solid-state imaging device 101 and the shutter device 311, and a signal processing unit 312.

The optical system 310 guides image light (incident light) from the object to a pixel unit 101a of the solid-state imaging device 101. This optical system 310 may be formed with a plurality of optical lenses. The shutter device 311 controls the light irradiation period and the light blocking period for the solid-state imaging device 101. The drive unit 313 controls transfer operations of the solid-state imaging device 101 and shutter operations of the shutter device 311. The signal processing unit 312 performs various kinds of signal processing on a signal output from the solid-state imaging device 101. A video signal Dout subjected to the signal processing is stored into a storage medium such as a memory, or is output to a monitor or the like.

Note that embodiments according to the present technology are not limited to the embodiments described above, and various modifications may be made to them without departing from the scope of the present technology.

Further, the advantageous effects described in this specification are merely examples, and the advantageous effects of the present technology are not limited to them and may include other effects.

The present technology may also be embodied in the configurations described below.

[1]

A solid-state imaging device including:

a photoelectric conversion unit that converts received light into an electric charge;

a memory unit that holds the electric charge transferred from the photoelectric conversion unit; and a light blocking unit that blocks light, in which the photoelectric conversion unit and the memory unit are formed in a semiconductor substrate, the light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit, and extend in the semiconductor substrate, the first embedded portion is disposed in a transfer region for transferring the electric charge from the photoelectric conversion unit to the memory unit, and the second embedded portion is disposed outside the transfer region, and the lid portion of the light blocking unit formed on the back surface side of the semiconductor substrate, which is the side at which light to the memory unit enters, includes at least one recessed structure.

[2]

The solid-state imaging device according to [1], further including a high-dielectric-constant material film on the back surface side of the semiconductor substrate, which is the side at which light enters the photoelectric conversion unit, in which the lid portion and the high-dielectric-constant material film are arranged in this order from the light incident side, and the at least one recessed structure is formed by digging the high-dielectric-constant material film, starting from a lower portion of the lid portion.

[3]

The solid-state imaging device according to [1], further including a high-dielectric-constant material film on the back surface side of the semiconductor substrate, which is the side at which light enters the photoelectric conversion unit, in which the lid portion and the high-dielectric-constant material film are arranged in this order from the light incident side, the semiconductor substrate includes a silicon layer, and the at least one recessed structure is formed by digging the high-dielectric-constant material film and the silicon layer, starting from a lower portion of the lid portion.

[4]

The solid-state imaging device according to [3], in which the silicon layer is a $P^+$-layer.

[5]

The solid-state imaging device according to [4], in which the at least one recessed structure and the $P^+$-layer are connected and dropped to the ground (GND).

[6]

The solid-state imaging device according to any one of [1] to [5], in which a plurality of pixels is arranged in a matrix, the at least one recessed structure is formed for each pixel, and a group of recessed structures in which the at least one recessed structure is continuously arranged between at least adjacent ones of the pixels is formed.

[7]

The solid-state imaging device according to [6], in which each recessed structure in the group of continuously arranged recessed structures is disposed in conformity with symmetry of the pixel.

[8]

The solid-state imaging device according to any one of [1] to [5], in which a plurality of pixels is arranged in a matrix, the at least one recessed structure is formed for each pixel, and a group of recessed structures in which the at least one recessed structure is discontinuously arranged between at least adjacent ones of the pixels is formed.

[9]

The solid-state imaging device according to [8], in which each recessed structure in the group of discontinuously arranged recessed structures is disposed in conformity with symmetry of the pixel.

[10]

An electronic apparatus including
a solid-state imaging device that is mounted in the electronic apparatus, in which
the solid-state imaging device includes:
a photoelectric conversion unit that converts received light into an electric charge;
a memory unit that holds the electric charge transferred from the photoelectric conversion unit; and
a light blocking unit that blocks light,
the photoelectric conversion unit and the memory unit are formed in a semiconductor substrate,
the light blocking unit is formed as a lid portion on the back surface side of the semiconductor substrate, which is the side at which light to the memory unit enters, and is also continuously formed including a first embedded portion and a second embedded portion that are embedded between the photoelectric conversion unit and the memory unit, and extend in the semiconductor substrate, and
the first embedded portion is disposed in a transfer region for transferring the electric charge from the photoelectric conversion unit to the memory unit, and the lid portion of the light blocking unit formed on the back surface side of the semiconductor substrate, which is the side at which light to the memory unit enters, includes at least one recessed structure.

[11]

An electronic apparatus including
the solid-state imaging device according to any one of [1] to [9].

REFERENCE SIGNS LIST

Light blocking unit
2, 3, 14, 15, 140 to 142, 150 to 152, 200, 300 Recessed structure
4 High-dielectric-constant material film
5(5-1, 5-2) Photodiode (photoelectric conversion unit: PD)
6 Memory unit (charge retention unit)
10, 20, 30, 30A, 30B, 30C, 40, 40A, 40B, 40C, 50, 60, 70, 90, 100, 500, 600, 1000 Solid-state imaging device

The invention claimed is:

1. A solid-state imaging device comprising:
a photoelectric conversion unit that converts received light into an electric charge;
a memory unit that holds the electric charge transferred from the photoelectric conversion unit; and
a light blocking unit that blocks light, wherein
the photoelectric conversion unit and the memory unit are formed in a semiconductor substrate,
the light blocking unit is formed as a lid portion on a back surface side of the semiconductor substrate, and is continuously formed to include a first embedded portion and a second embedded portion that are embedded between the photoelectric conversion unit and the memory unit and extend in the semiconductor substrate, the back surface side of the semiconductor substrate being a side at which light to the memory unit enters,
the first embedded portion is disposed in a transfer region to transfer the electric charge from the photoelectric conversion unit to the memory unit, and the second embedded portion is disposed outside the transfer region, and
the lid portion of the light blocking unit formed on the back surface side of the semiconductor substrate includes at least one recessed structure, the back surface side of the semiconductor substrate being the side at which light to the memory unit enters.

2. The solid-state imaging device according to claim 1, further comprising
a high-dielectric-constant material film on the back surface side of the semiconductor substrate, the back surface side of the semiconductor substrate being a side at which light enters the photoelectric conversion unit, wherein
the lid portion and the high-dielectric-constant material film are arranged in this order from a light incident side, and
the at least one recessed structure is formed by digging the high-dielectric-constant material film, starting from a lower portion of the lid portion.

3. The solid-state imaging device according to claim 1, wherein a plurality of pixels is arranged in a matrix, the at least one recessed structure is formed for each pixel of the plurality of pixels, and a group of recessed structures in which the at least one recessed structure is continuously arranged between at least adjacent pixels of the plurality of pixels is formed.

4. The solid-state imaging device according to claim 3, wherein each recessed structure in the group of continuously arranged recessed structures is disposed in conformity with symmetry of the plurality of pixels.

5. The solid-state imaging device according to claim 1, wherein a plurality of pixels is arranged in a matrix, the at least one recessed structure is formed for each pixel of the plurality of pixels, and a group of recessed structures in which the at least one recessed structure is discontinuously arranged between at least adjacent pixels of the plurality of pixels is formed.

6. The solid-state imaging device according to claim 5, wherein each recessed structure in the group of discontinuously arranged recessed structures is disposed in conformity with symmetry of the plurality of pixels.

7. The solid-state imaging device according to claim 1, further comprising
a high-dielectric-constant material film on the back surface side of the semiconductor substrate, the back surface side of the semiconductor substrate being a side at which light enters the photoelectric conversion unit, wherein the lid portion and the high-dielectric-constant material film are arranged in this order from a light incident side, the semiconductor substrate includes a silicon layer, and the at least one recessed structure is formed by digging the high-dielectric-constant material film and the silicon layer, starting from a lower portion of the lid portion.

8. The solid-state imaging device according to claim 7, wherein the silicon layer is a $P^+$-layer.

9. The solid-state imaging device according to claim 8, wherein the at least one recessed structure and the $P^+$-layer are connected and dropped to ground (GND).

10. An electronic apparatus comprising a solid-state imaging device that is mounted in the electronic apparatus, wherein the solid-state imaging device includes:

a photoelectric conversion unit that converts received light into an electric charge;

a memory unit that holds the electric charge transferred from the photoelectric conversion unit; and a light blocking unit that blocks light, the photoelectric conversion unit and the memory unit are formed in a semiconductor substrate, the light blocking unit is formed as a lid portion on a back surface side of the semiconductor substrate, and is continuously formed to include a first embedded portion and a second embedded portion that are embedded between the photoelectric conversion unit and the memory unit and extend in the semiconductor substrate, the back surface side of the semiconductor substrate being a side at which light to the memory unit enters, the first embedded portion is disposed in a transfer region to transfer the electric charge from the photoelectric conversion unit to the memory unit, and the second embedded portion is disposed outside the transfer region, and the lid portion of the light blocking unit formed on the back surface side of the semiconductor substrate includes at least one recessed structure, the back surface side of the semiconductor substrate being the side at which light to the memory unit enters.

* * * * *